US012618145B2

(12) United States Patent
Chiba et al.

(10) Patent No.: US 12,618,145 B2
(45) Date of Patent: May 5, 2026

(54) FILM-FORMING METHOD AND FILM-FORMING APPARATUS

(71) Applicant: Tokyo Electron Limited, Tokyo (JP)

(72) Inventors: Takashi Chiba, Iwate (JP); Sayaka Saijo, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/774,058

(22) Filed: Jul. 16, 2024

(65) Prior Publication Data

US 2025/0034699 A1     Jan. 30, 2025

(30) Foreign Application Priority Data

Jul. 27, 2023     (JP) ................................. 2023-122106

(51) Int. Cl.
*C23C 16/24* (2006.01)
*C23C 16/50* (2006.01)
*C23C 16/52* (2006.01)
*C23C 16/56* (2006.01)

(52) U.S. Cl.
CPC .............. *C23C 16/24* (2013.01); *C23C 16/50* (2013.01); *C23C 16/52* (2013.01); *C23C 16/56* (2013.01)

(58) Field of Classification Search
CPC ...... C23C 16/402; C23C 16/345; C23C 16/24
See application file for complete search history.

(56) References Cited

U.S. PATENT DOCUMENTS

2009/0203227 A1*   8/2009   Hasebe ................. C23C 16/402
                                                                257/E21.24

FOREIGN PATENT DOCUMENTS

JP          2013135154 A   *   5/2013   ........... H01L 21/316
JP          2013-135154           7/2013
KR          20120070516 A   *   6/2012   ........... C23C 16/345

* cited by examiner

*Primary Examiner* — Dah-Wei D. Yuan
*Assistant Examiner* — Andrew J Bowman
(74) *Attorney, Agent, or Firm* — IPUSA, PLLC

(57)          ABSTRACT

A film-forming method includes (a) supplying an aminosilane-based gas to a recess formed at a substrate and adsorbing the aminosilane-based gas to an inner surface of the recess, (b) supplying an oxidizing gas to the recess to which the aminosilane-based gas is adsorbed and reacting the aminosilane-based gas with the oxidizing gas, (c) exposing the substrate to a plasma generated from a modification gas, and (d) repeatedly performing a first process including (a), (b), and (c) in an order of (a), (b), and (c), thereby forming a silicon-containing film. (d) includes changing a temperature of the substrate during repetition of the first process.

5 Claims, 16 Drawing Sheets

FILM-FORMING METHOD AND FILM-FORMING APPARATUS

CROSS-REFERENCE TO RELATED APPLICATIONS

This application is based upon and claims priority to Japanese Patent Application No. 2023-122106, filed on Jul. 27, 2023, the entire contents of which are incorporated herein by reference.

BACKGROUND

1. Field of the Invention

The present disclosure relates to film-forming methods and film-forming apparatuses.

2. Description of the Related Art

A technique of forming a film in a recess formed at a substrate from a reaction product of a first reactive gas and a second reactive gas that is reactive with the first reactive gas, is known. See, for example, Japanese Patent Application Publication No. 2013-135154. In Japanese Patent Application Publication No. 2013-135154, hydroxy groups are adsorbed on an inner surface of the recess in a desired distribution, followed by supplying the first reactive gas and the second reactive gas in this order, thereby controlling a distribution of a thickness of a film formed in the recess.

SUMMARY

A film-forming method according to an aspect of the present disclosure includes: (a) supplying an aminosilane-based gas to a recess formed at a substrate and adsorbing the aminosilane-based gas to an inner surface of the recess; (b) supplying an oxidizing gas to the recess to which the aminosilane-based gas is adsorbed and reacting the aminosilane-based gas with the oxidizing gas; (c) exposing the substrate to a plasma generated from a modification gas; and (d) repeatedly performing a first process including (a), (b), and (c) in an order of (a), (b), and (c), thereby forming a silicon-containing film. (d) includes changing a temperature of the substrate during repetition of the first process.

DETAILED DESCRIPTION OF THE INVENTION

Figure 1:
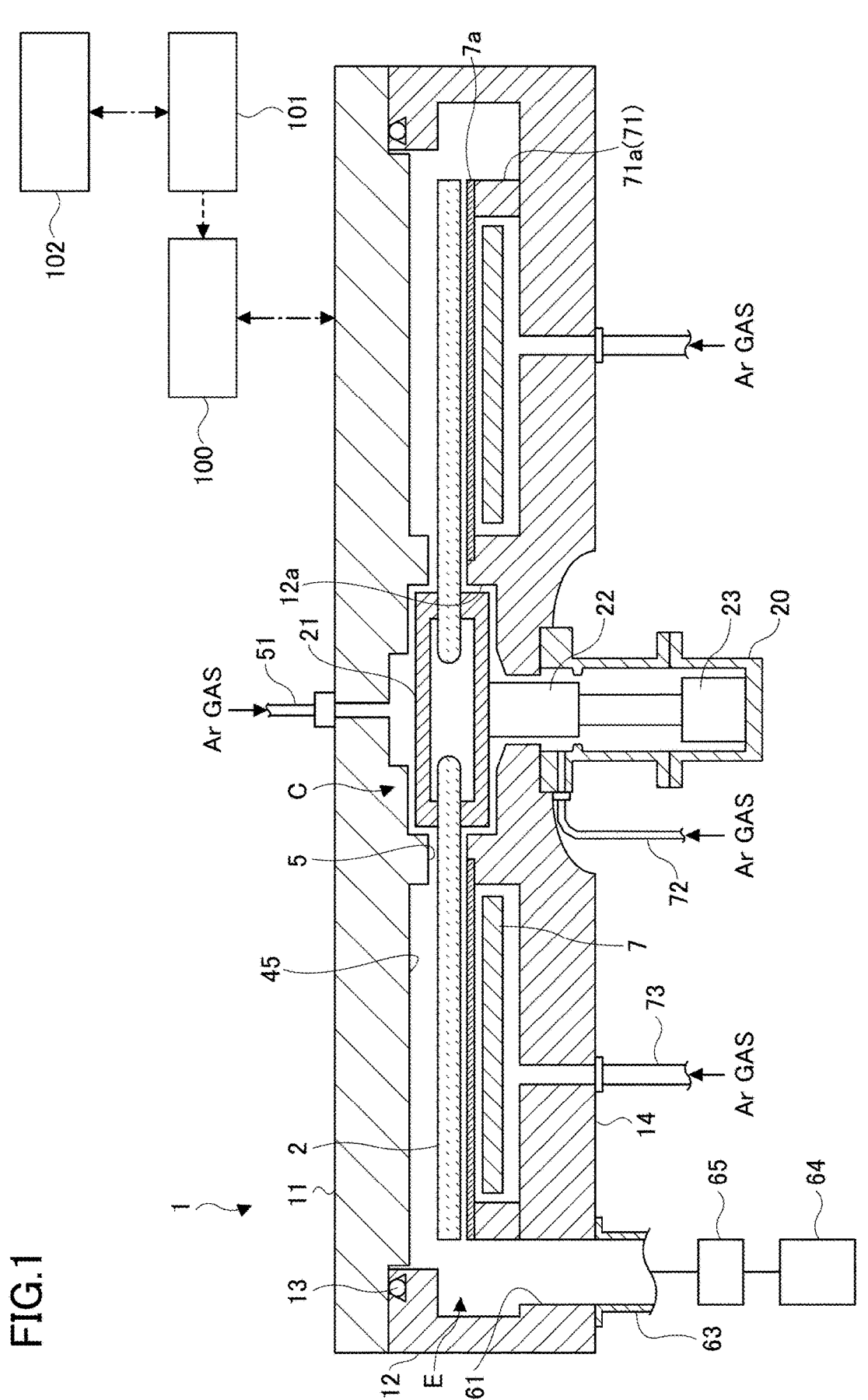
FIG. 1 is a schematic cross-sectional view illustrating a film-forming apparatus according to an embodiment.

The present disclosure provides a technique of being able to control the shape of a silicon-containing film embedded in a recess formed at a substrate.

Hereinafter, non-limiting embodiments of the present disclosure will be described with reference to the drawings. In the drawings, the same or corresponding members or components are designated by the same reference symbols, and duplicate description thereof will be omitted.

[Film-Forming Apparatus]

A film-forming apparatus suitable for performing a film-forming method according to an embodiment will be described with reference to FIGS. 1 to 3. The film-forming apparatus includes: a flat vacuum chamber 1 having an approximately circular planar shape; and a rotation table 2 provided in the vacuum chamber 1 and having a rotation center at the center of the vacuum chamber 1. The vacuum chamber 1 includes: a cylindrical chamber body 12 having a bottom; and a top plate 11 that is hermetically detachably disposed on the upper surface of the chamber body 12 via a seal member 13, such as an O-ring or the like.

The rotation table 2 is fixed to a cylindrical core 21 at a center thereof. The core 21 is fixed to an upper end of a rotation shaft 22 extending in a vertical direction. The rotation shaft 22 penetrates a bottom 14 of the vacuum chamber 1, and the lower end thereof is attached to a driver 23 configured to rotate the rotation shaft 22 about a vertical axis. The rotation shaft 22 and the driver 23 are housed in a cylindrical casing 20 having an opened upper surface. In the casing 20, a flange provided on the upper surface is hermetically attached to the lower surface of the bottom 14 of the vacuum chamber 1. Thereby, the hermetical state between the internal atmosphere of the casing 20 and the external atmosphere is maintained.

Figure 2:
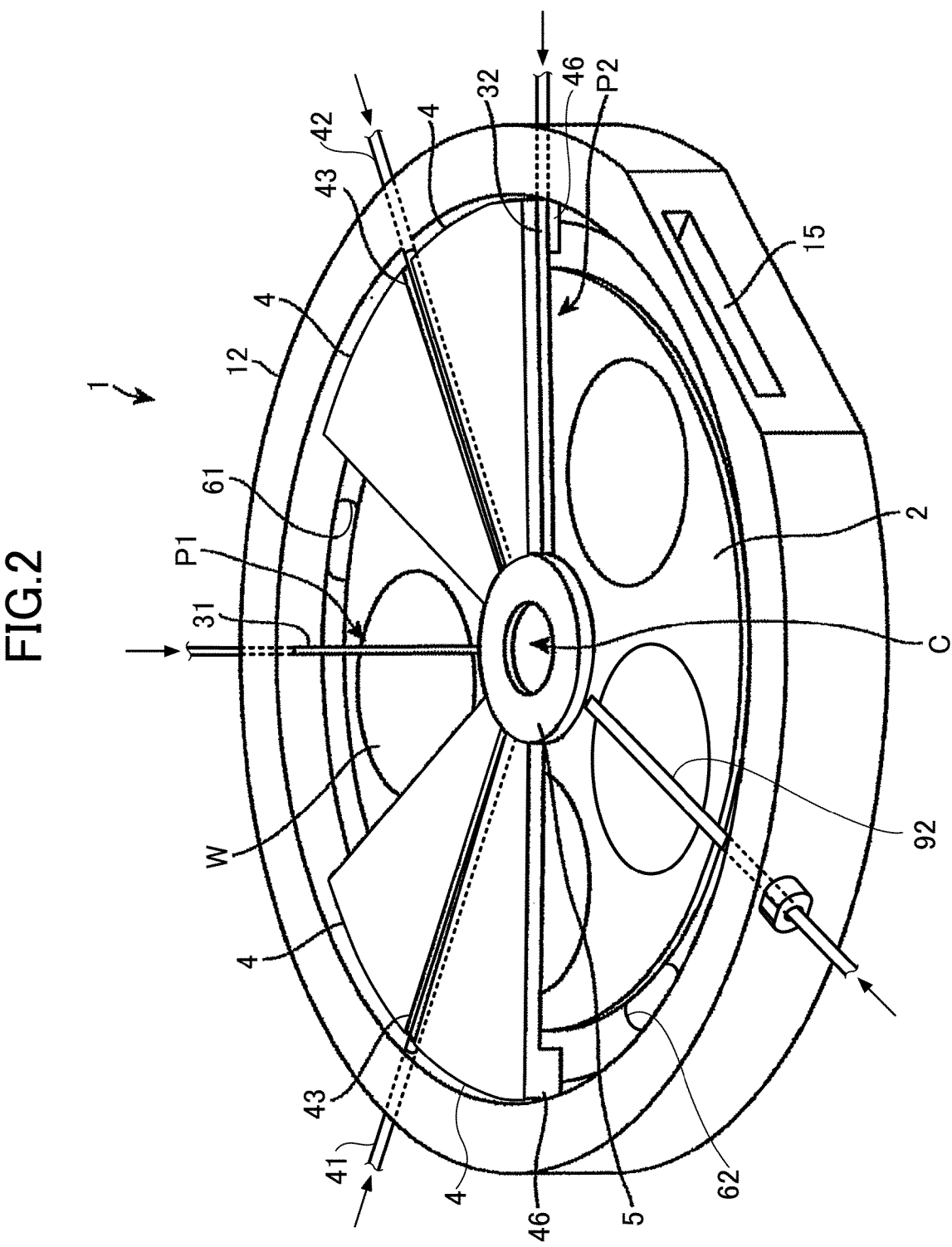
FIG. 2 is a schematic perspective view illustrating an internal configuration of a vacuum chamber of the film-forming apparatus of FIG. 1.
Figure 3:
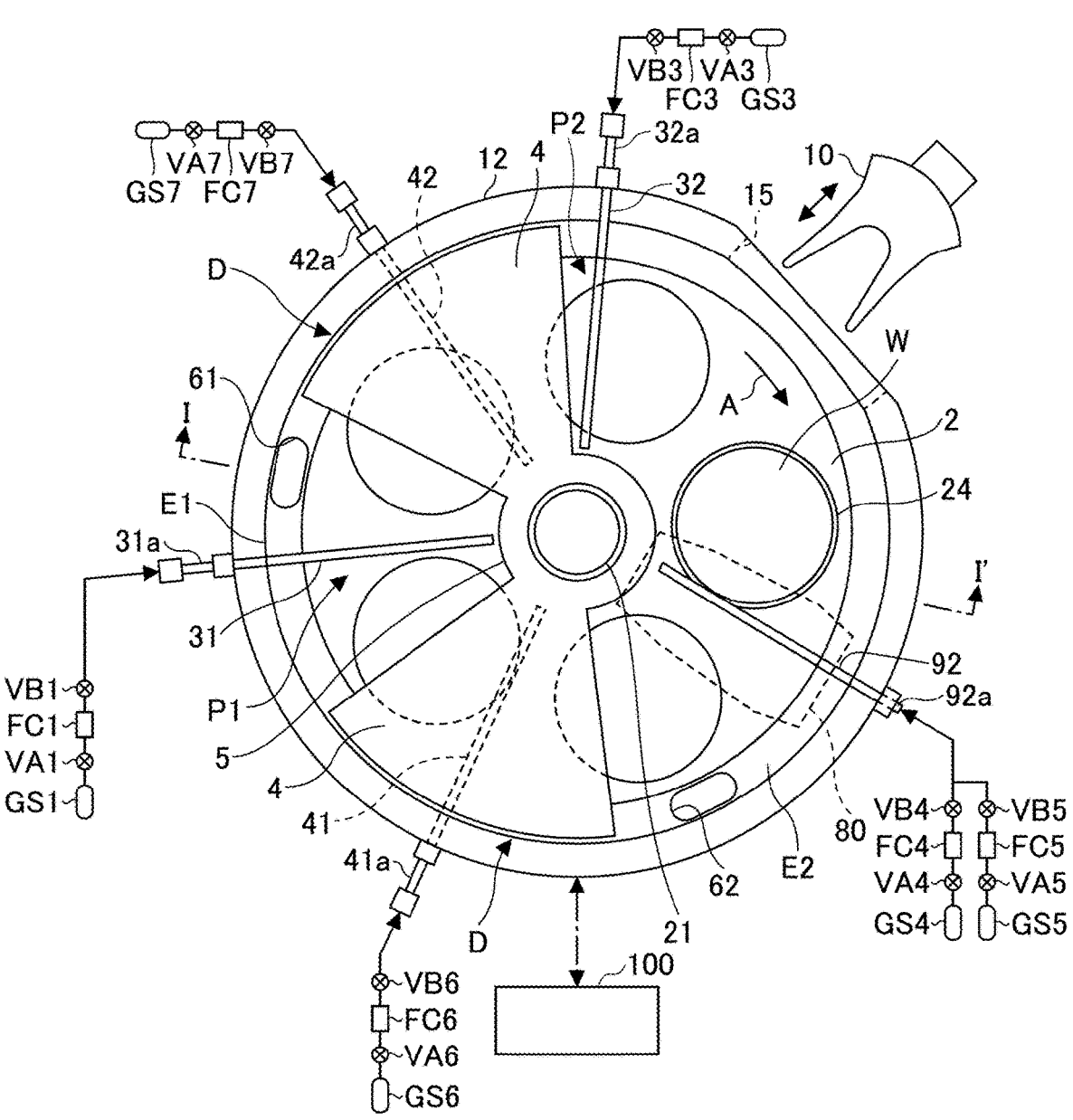
FIG. 3 is a schematic plan view illustrating an internal configuration of the vacuum chamber of the film-forming apparatus of FIG. 1.

As illustrated in FIGS. 2 and 3, a surface section of the rotation table 2 is provided with circular stages 24 on which a plurality of (five in the illustrated example) substrates W are to be placed along a rotating direction (circumferential direction) of the rotation table 2. The substrate W may be, for example, a semiconductor wafer, such as a silicon wafer or the like. For the sake of convenience, FIG. 3 illustrates the substrate W at only one of the stages 24. The stage 24 has an inner diameter slightly larger (e.g., by 4 millimeters (mm)) than the diameter of the substrate W, and has a depth that is substantially equal to the thickness of the substrate W. In this case, when the substrate W is housed in the stage 24, the surface of the substrate W becomes equal in height to the surface of the rotation table 2 (a region thereof in which the substrate W is not placed). The bottom surface of the stage 24 is provided with unillustrated through-holes through which unillustrated raising and lowering pins (e.g., three pins) configured to support the rear surface of the substrate W and raise and lower the substrate W.

FIGS. 2 and 3 are views describing the internal structure of the vacuum chamber 1, and illustration of the top plate 11 is omitted for the sake of convenience. As illustrated in FIGS. 2 and 3, reactive gas nozzles 31 and 32, separation gas nozzles 41 and 42, and a processing gas nozzle 92 are disposed above the rotation table 2 at intervals in the circumferential direction of the vacuum chamber 1. In the illustrated example, the processing gas nozzle 92, the separation gas nozzle 41, the reactive gas nozzle 31, the separation gas nozzle 42, and the reactive gas nozzle 32 are disposed in this order clockwise (in the rotating direction indicated by arrow A in FIG. 3) from a transfer port 15 as described below. The reactive gas nozzles 31 and 32, the separation gas nozzles 41 and 42, and the processing gas nozzle 92 are an example of a gas supply, and are formed of quartz or the like. Gas introduction ports 31a, 32a, 41a, 42a, and 92a (i.e., base ends) of the reactive gas nozzles 31 and 32, the separation gas nozzles 41 and 42, and the processing gas nozzle 92 are fixed to the outer circumferential wall of the chamber body 12. Thereby, the reactive gas nozzles 31 and 32, the separation gas nozzles 41 and 42, and the processing gas nozzle 92 are introduced into the vacuum chamber 1 from the outer circumferential wall of the vacuum chamber 1, and attached so as to extend horizontally with respect to the rotation table 2 along a radial direction of the chamber body 12.

A plasma generator 80 is provided above the processing gas nozzle 92, as illustrated in FIG. 3 in a simplified manner with a dashed line. The plasma generator 80 will be described below.

A supply source GS1 to be charged with an aminosilane-based gas is connected to the reactive gas nozzle 31. The reactive gas nozzle 31 supplies the aminosilane-based gas from the supply source GS1 into the vacuum chamber 1. The flow rate of the first aminosilane-based gas supplied from the supply source GS1 is controlled by a flow rate controller FC1. Supply of the aminosilane-based gas from the supply source GS1 into the vacuum chamber 1, and stop of the supply are controlled by valves VA1 and VB1. A supply source to be charged with another gas, such as an inert gas, may be further connected to the reactive gas nozzle 31.

The aminosilane-based gas is, for example, a tris(dimethylamino) silane (3DMAS) gas. The aminosilane-based gas may be a bis(dimethylamino) silane (BDMAS) gas, a bis(diethylamino) silane (BDEAS) gas, a bis(tertiary-butylamino) silane (BTBAS) gas, a di(isopropylamino) silane (DIPAS) gas, or a di-sec-butylaminosilane (DSBAS) gas.

A supply source GS3 to be charged with an oxidizing gas is connected to the reactive gas nozzle 32. The reactive gas nozzle 32 is configured to supply the oxidizing gas from the supply source GS3, into the vacuum chamber 1. The flow rate of the oxidizing gas from the supply source GS3 is controlled by a flow rate controller FC3. Supply of the oxidizing gas from the supply source GS3 into the vacuum chamber 1, and stop of the supply are controlled by valves VA3 and VB3. A supply source to be charged with another gas, such as an inert gas, may be further connected to the reactive gas nozzle 32. For example, the oxidizing gas is an ozone ($O_3$) gas. The oxidizing gas may be an oxygen ($O_2$) gas, water ($H_2O$), or a hydrogen peroxide ($H_2O_2$) gas.

A supply source GS4 to be charged with the modification gas and a supply source GS5 to be charged with a dilution gas are connected to the processing gas nozzle 92. The processing gas nozzle 92 is configured to supply the modification gas from the supply source GS4 into the vacuum chamber 1 and supply the dilution gas from the supply source GS5 into the vacuum chamber 1. The flow rates of the modification gas and the dilution gas from the supply sources GS4 and GS5 are controlled by corresponding flow rate controllers FC4 and FC5. Supply of the modification gas and the dilution gas from the supply sources GS4 and GS5 into the vacuum chamber 1, and stop of the supply are controlled by corresponding valves VA4, VB4, VA5, and VB5. A supply source to be charged with another gas may be further connected to the processing gas nozzle 92. For example, the modification gas is an ammonia ($NH_3$) gas. For example, the dilution gas is an argon (Ar) gas.

A supply source GS6 to be charged with the separation gas is connected to the separation gas nozzle 41. The separation gas nozzle 41 is configured to supply a separation gas from the supply source GS6 into the vacuum chamber 1. The flow rate of the separation gas from the supply source GS6 is controlled by a flow rate controller FC6. Supply of the separation gas from the source GS6 into the vacuum chamber 1, and stop of the supply are controlled by valves VA6 and VB6.

A supply source GS7 to be charged with the separation gas is connected to the separation gas nozzle 42. The separation gas nozzle 42 is configured to supply the separation gas from the supply source GS7 into the vacuum chamber 1. The flow rate of the separation gas from the supply source GS7 is controlled by a flow rate controller FC7. Supply of the separation gas from the source GS7 into the vacuum chamber 1, and stop of the supply are controlled by valves VA7 and VB7.

For example, the separation gas is an Ar gas. The separation gas may be an inert gas, and may be a nitrogen ($N_2$) gas.

The reactive gas nozzles 31 and 32 are provided with a plurality of discharge holes 33 (FIG. 4) that are opened toward the rotation table 2. The discharge holes 33 are disposed at intervals of, for example, 10 mm along the length direction of the reactive gas nozzles 31 and 32. The lower region of the reactive gas nozzle 31 becomes a first processing region P1 in which a silicon-containing gas is to be adsorbed to the substrate W. The lower region of the reactive gas nozzle 32 becomes a second processing region P2 in which the silicon-containing gas, adsorbed to the substrate W in the first processing region P1, is to be oxidized.

As illustrated in FIGS. 2 and 3, two projecting portions 4 are provided in the vacuum chamber 1. The projecting portions 4 form separation regions D together with the separation gas nozzles 41 and 42. Therefore, as described below, the projecting portions 4 are attached to the rear surface of the top plate 11 so as to project toward the rotation table 2. The projecting portions 4 have a fan-like planar shape having a top portion that is cut into an arc shape. The projecting portions 4 are disposed, for example, such that the inner arc thereof is connected to a projection 5 (described below) and the outer arc thereof is along the inner circumferential surface of the chamber body 12 of the vacuum chamber 1.

Figure 4:
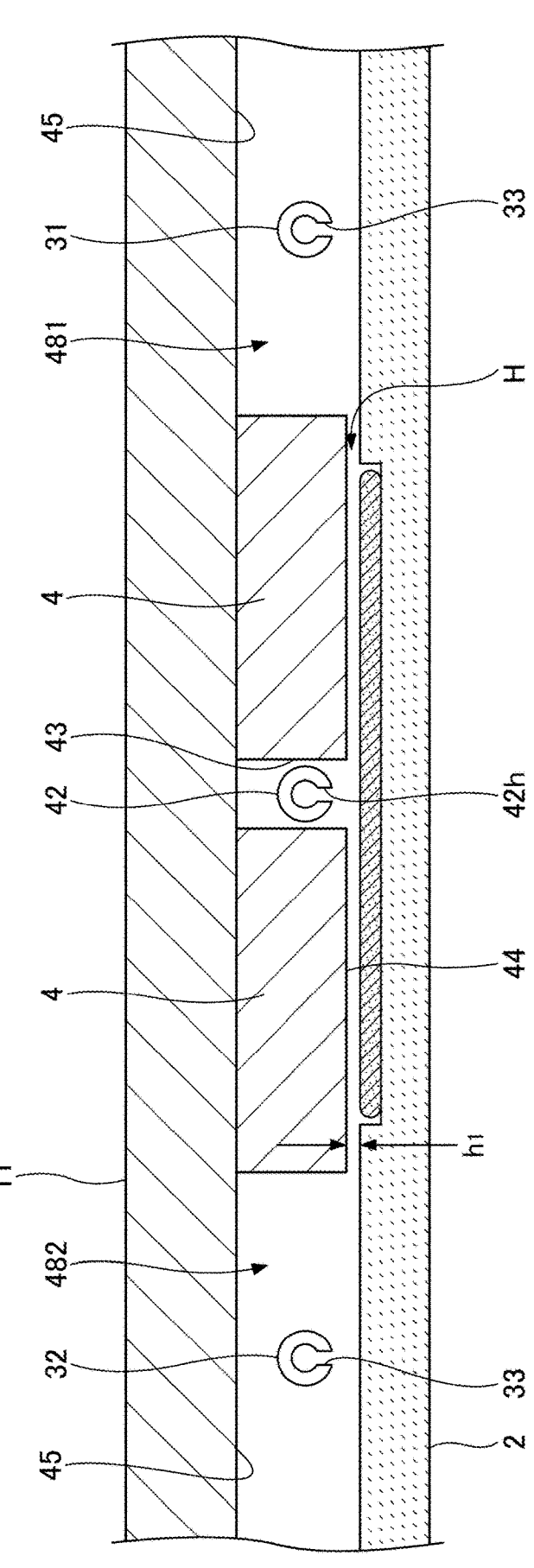
FIG. 4 is a schematic cross-sectional view of the film-forming apparatus of FIG. 1, taken along a concentric circle of a rotation table provided in the vacuum chamber.

FIG. 4 illustrates a cross section of the vacuum chamber 1 taken along a concentric circle of the rotation table 2 from the reactive gas nozzle 31 to the reactive gas nozzle 32. As illustrated, the projecting portion 4 is attached to the rear surface of the top plate 11, and thus the vacuum chamber 1 includes: a flat low ceiling surface 44 (first ceiling surface) that is the lower surface of the projecting portion 4; and a ceiling surface 45 (second ceiling surface) that is higher than the ceiling surface 44 and is located on both sides of the ceiling surface 44 in the circumferential direction. The ceiling surface 44 has a fan-like planar shape having a top portion that is cut into an arc shape. As illustrated, one of the projecting portions 4 is provided with a groove 43 at the center thereof in the circumferential direction so as to extend in a radial direction, and the separation gas nozzle 41 is housed in the groove 43. Similarly, the other projecting portion 4 is provided with the groove 43, and the separation gas nozzle 41 is housed in the groove 43. Spaces 481 and 482 below the higher ceiling surface 45 are provided with the reactive gas nozzles 31 and 32. The reactive gas nozzles 31 and 32 are provided apart from the ceiling surface 45 and in the vicinity of the substrate W.

The separation gas nozzle 42 is provided with a plurality of discharge holes $42h$ (see FIG. 4) that are opened toward the rotation table 2. The discharge holes $42h$ are disposed at intervals of, for example, 10 mm along the length direction of the separation gas nozzle 42. Similar to the separation gas nozzle 42, the separation gas nozzle 41 is provided with a plurality of unillustrated discharge holes that are opened toward the rotation table 2. The unillustrated discharge holes are disposed at intervals of, for example, 10 mm along the length direction of the separation gas nozzle 41.

A small separation space H is formed between the ceiling surface 44 and the rotation table 2. When the separation gas is supplied from the discharge holes $42h$ of the separation gas nozzle 42, the separation gas flows through the separation space H toward the spaces 481 and 482. At this time, the volume of the separation space H is smaller than the volume of the spaces 481 and 482. Therefore, the separation gas can increase the pressure of the separation space H compared to the pressure of the spaces 481 and 482. That is, the separation space H having a high pressure is formed between the spaces 481 and 482. The separation gas flowing out from the separation space H to the spaces 481 and 482 serves as a counter flow against the aminosilane-based gas from the first processing region P1 and the oxidizing gas from the second processing region P2. Thereby, the aminosilane-based gas from the first processing region P1 is separated from the oxidizing gas from the second processing region P2 by the presence of the separation space H. This suppresses mixing and reaction between the aminosilane-based gas with the oxidizing gas in the vacuum chamber 1.

A height h1 of the ceiling surface 44 from the upper surface of the rotation table 2 is set to a height that is suitable for increasing the pressure of the separation space H compared to the pressure of the spaces 481 and 482, considering the internal pressure of the vacuum chamber 1 upon processing the substrate, the rotation speed of the rotation table 2, the amount of the separation gas to be supplied, and the like.

The lower surface of the top plate 11 is provided with the projection 5 (FIGS. 2 and 3) enclosing the outer circumference of the core 21 that is configured to fix the rotation table 2. For example, the projection 5 is continuous with a site of the projecting portion 4 that is closer to the rotation center, and the lower surface of the projection 5 is formed at the same height as the ceiling surface 44.

Figure 5:
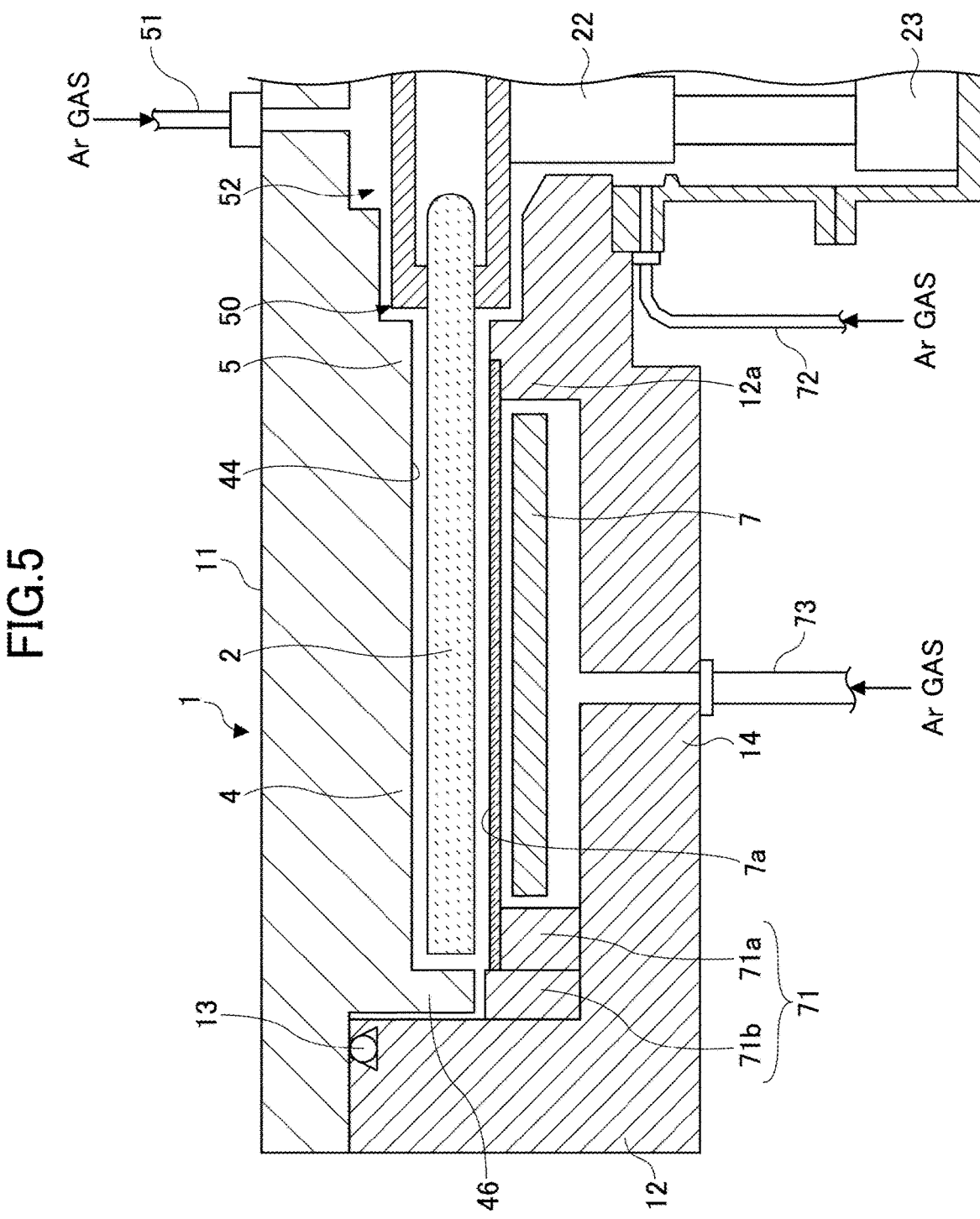
FIG. 5 is another schematic cross-sectional view of the film-forming apparatus of FIG. 1.

FIG. 1, which was previously referred to, is a cross-sectional view taken along the line I-I' of FIG. 3, and illustrates a region in which the ceiling surface 45 is provided. Meanwhile, FIG. 5 is a cross-sectional view illustrating a region in which the ceiling surface 44 is provided. As illustrated in FIG. 5, the circumferential edge of the fan-like projecting portion 4 (a portion of the vacuum chamber 1 on the outer edge side thereof) is provided with a bent portion 46, which is bent in an L shape, so as to face the outer end surface of the rotation table 2. Similar to the projecting portion 4, the bent portion 46 suppresses entry of the aminosilane-based gas and the oxidizing gas from both sides of the separation region D, and suppresses mixing of the aminosilane-based gas with the oxidizing gas. The fan-like projecting portion 4 is provided on the top plate 11, and the top plate 11 can be removed from the chamber body 12. Therefore, a small gap exists between the outer circumferential surface of the bent portion 46 and the chamber body 12. The gap between the inner circumferential surface of the bent portion 46 and the outer end surface of the rotation table 2, and the gap between the outer circumferential surface of the bent portion 46 and the chamber body 12 are set, for example, to the same dimension as the height of the ceiling surface 44 from the upper surface of the rotation table 2.

In the separation region D, the inner circumferential wall of the chamber body 12 is formed as a vertical surface in the vicinity of the outer circumferential surface of the bent portion 46 as illustrated in FIG. 5. In the region other than the separation region D, for example, as illustrated in FIG. 1, the inner wall of the chamber body 12 is recessed toward the bottom 14 and outward at a portion facing the outer end surface of the rotation table 2. Hereinafter, for the sake of convenience, this recessed portion having an approximately rectangular cross-sectional shape is referred to as a gas exhaustion region E. Specifically, the gas exhaustion region in communication with the first processing region P1 is referred to as a first gas exhaustion region E1, and the region in communication with the second processing region P2 is referred to as the second gas exhaustion region E2. As illustrated in FIGS. 1 to 3, a first gas exhaustion port 61 and a second gas exhaustion port 62 are formed at the bottom of the first gas exhaustion region E1 and the second gas exhaustion region E2. The first gas exhaustion port 61 and the second gas exhaustion port 62 are connected to a vacuum pump 64 via a gas exhaustion tube 63 as illustrated in FIG. 1. The gas exhaustion tube 63 is provided with a pressure controller 65.

As illustrated in FIGS. 1 and 5, a heater 7 is provided in the space between the rotation table 2 and the bottom 14 of the vacuum chamber 1. The heater 7 is configured to heat the substrate W on the rotation table 2 through the rotation table 2 to a temperature determined by a process recipe. An annular cover 71 is provided on the lower side in the vicinity of the circumferential edge of the rotation table 2 (FIG. 5). The cover 71 separates an atmosphere from the upper space of the rotation table 2 to the gas exhaustion regions E1 and E2, from an atmosphere in which the heater 7 is placed. Thus, the cover 71 suppresses entry of a gas into the lower region of the rotation table 2. The cover 71 includes an inner member 71a and an outer member 71b. The inner member 71a is provided so as to face from below: an outer edge portion of the rotation table 2; and a portion extending beyond the outer edge portion toward the outer circumference. The outer member 71b is provided between the inner member 71a and the inner wall surface of the vacuum chamber 1. In the separation region D, the outer member 71b is provided below the bent portion 46 formed at the outer edge portion of the projecting portion 4, and the outer member 71b is provided in proximity to the bent portion 46. The inner member 71a encloses the entire circumference of the heater 7 below the outer edge portion of the rotation table 2 (and below a portion thereof that is slightly external of the outer edge portion).

The bottom 14 at a position closer to the center of rotation than is the space in which the heater 7 is disposed projects upward so as to approach the core 21 in the vicinity of the center of the lower surface of the rotation table 2. As a result, the bottom 14 at this position forms a projecting portion 12a. The space between the projecting portion 12a and the core 21 is a small space. Also, the gap between: the rotation shaft 22 penetrating the bottom 14; and the inner circumferential surface of a through-hole of the rotation shaft 22 is narrow. These small space and narrow gap communicate with the casing 20. The casing 20 is provided with a purge gas supply tube 72 through which a purge gas is supplied into the small space and narrow gap for purging. The purge gas is, for example, an Ar gas. The purge gas may be a Ne gas. The bottom 14 of the vacuum chamber 1 is provided with a plurality of purge gas supply tubes 73 used for purging the space in which the heater 7 is disposed. The purge gas supply tubes 73 are disposed at predetermined angle intervals in the circumferential direction below the heater 7. FIG. 5 illustrates one of the purge gas supply tubes 73. A cover 7a is provided between the heater 7 and the rotation table 2 for preventing entry of a gas into the region in which the heater 7 is provided. The cover 7a covers, along the circumferential direction, the space between the inner circumferential wall of the outer member 71b (the upper surface of the inner member 71a) and the upper end of the projecting portion 12a. The cover 7a can be formed of quartz or the like.

A separation gas supply tube 51 is connected to the center of the top plate 11 of the vacuum chamber 1. The separation gas supply tube 51 supplies a separation gas to a space 52 between the top plate 11 and the core 21. The separation gas supplied to the space 52 passes through a small space 50 between the projection 5 and the rotation table 2, and is discharged toward the circumferential edge of the rotation table 2 along a surface of the rotation table 2 closer to the region in which the substrate is placed. By the presence of the separation gas, the space 50 can be maintained at a pressure higher than those of the spaces 481 and 482. Therefore, the space 50 suppresses mixing, through a center region C, of: the aminosilane-based gas supplied to the first processing region P1; and the oxidizing gas supplied to the second processing region P2. That is, the space 50 (or the center region C) functions like the separation space H (or the separation region D) does.

As illustrated in FIGS. 2 and 3, the side wall of the vacuum chamber 1 is provided with a transfer port 15 through which transfer of the substrate W is performed between an external transfer arm 10 and the rotation table 2. The transfer port 15 is opened and closed by an unillustrated gate valve. The transfer of the substrate W between the transfer arm 10 and the rotation table 2 is performed at a position facing the transfer port 15. A site corresponding to the transfer position on the lower side of the rotation table 2 is provided with unillustrated raising and lowering pins for transfer that penetrate the stage 24 and raise the substrate W from the rear surface of the substrate W, and with an unillustrated raising and lowering mechanism for transfer.

Figure 6:
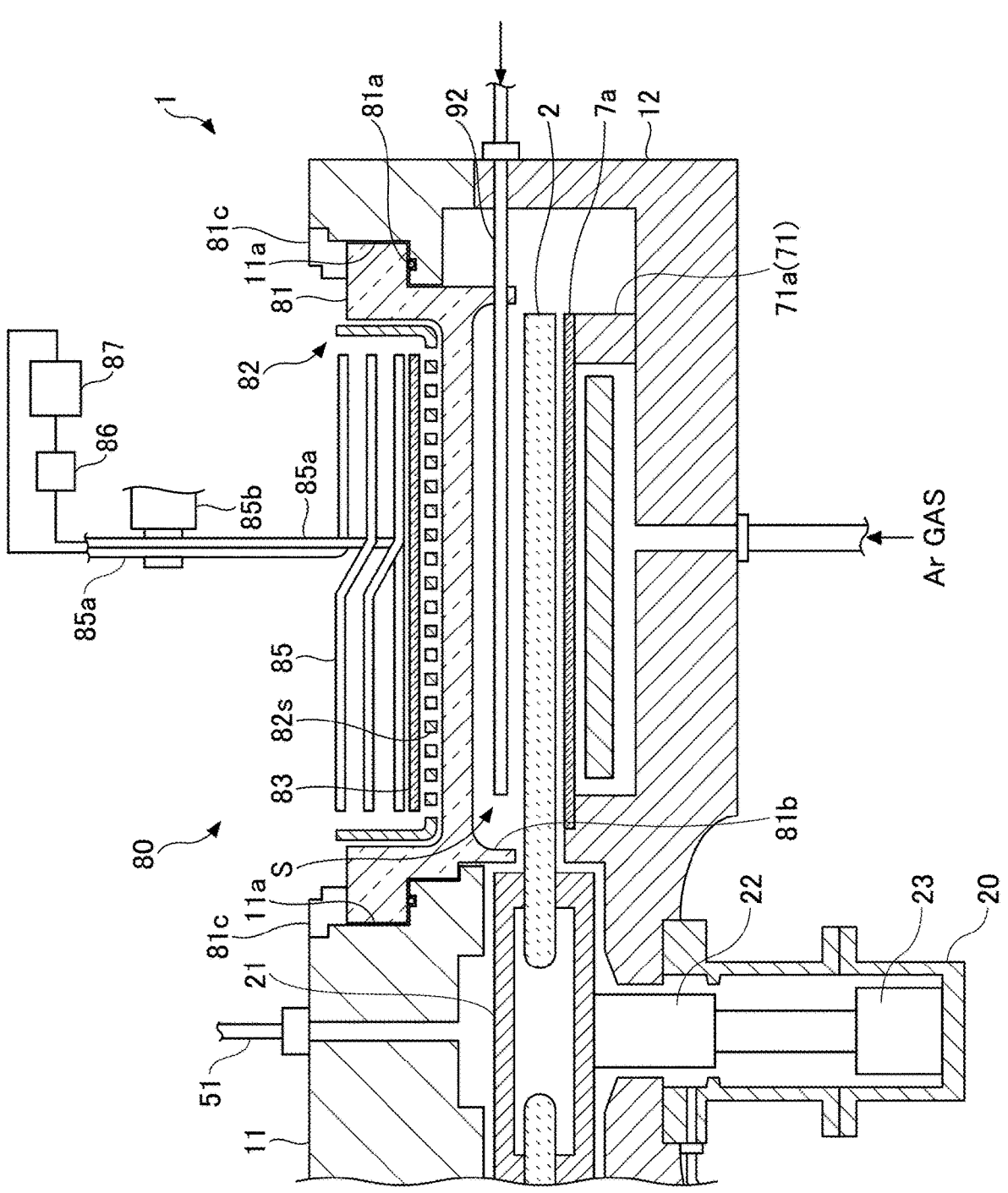
FIG. 6 is a schematic cross-sectional view illustrating a plasma generator provided in the film-forming apparatus of FIG. 1.
Figure 7:
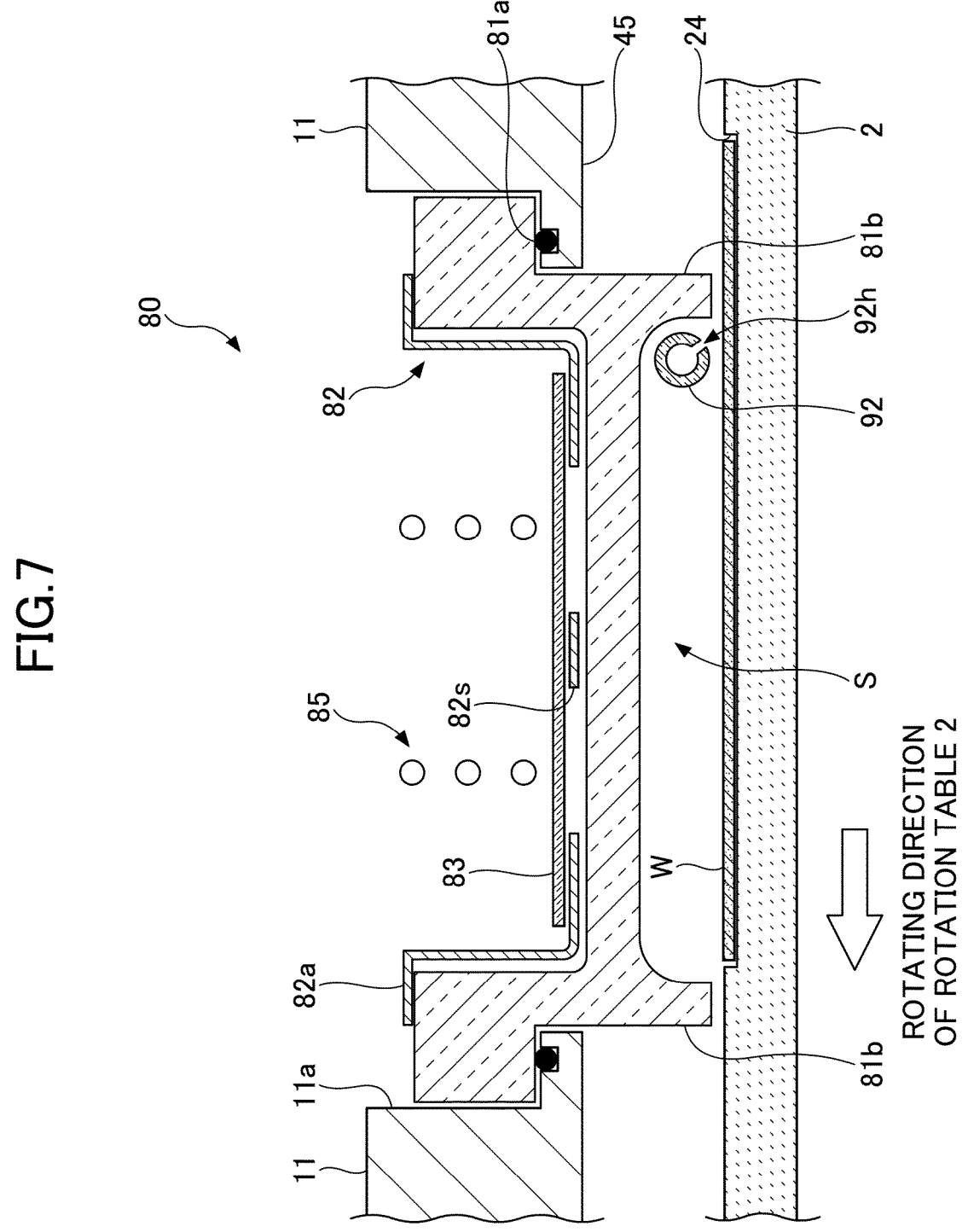
FIG. 7 is another schematic cross-sectional view illustrating the plasma generator provided in the film-forming apparatus of FIG. 1.
Figure 8:
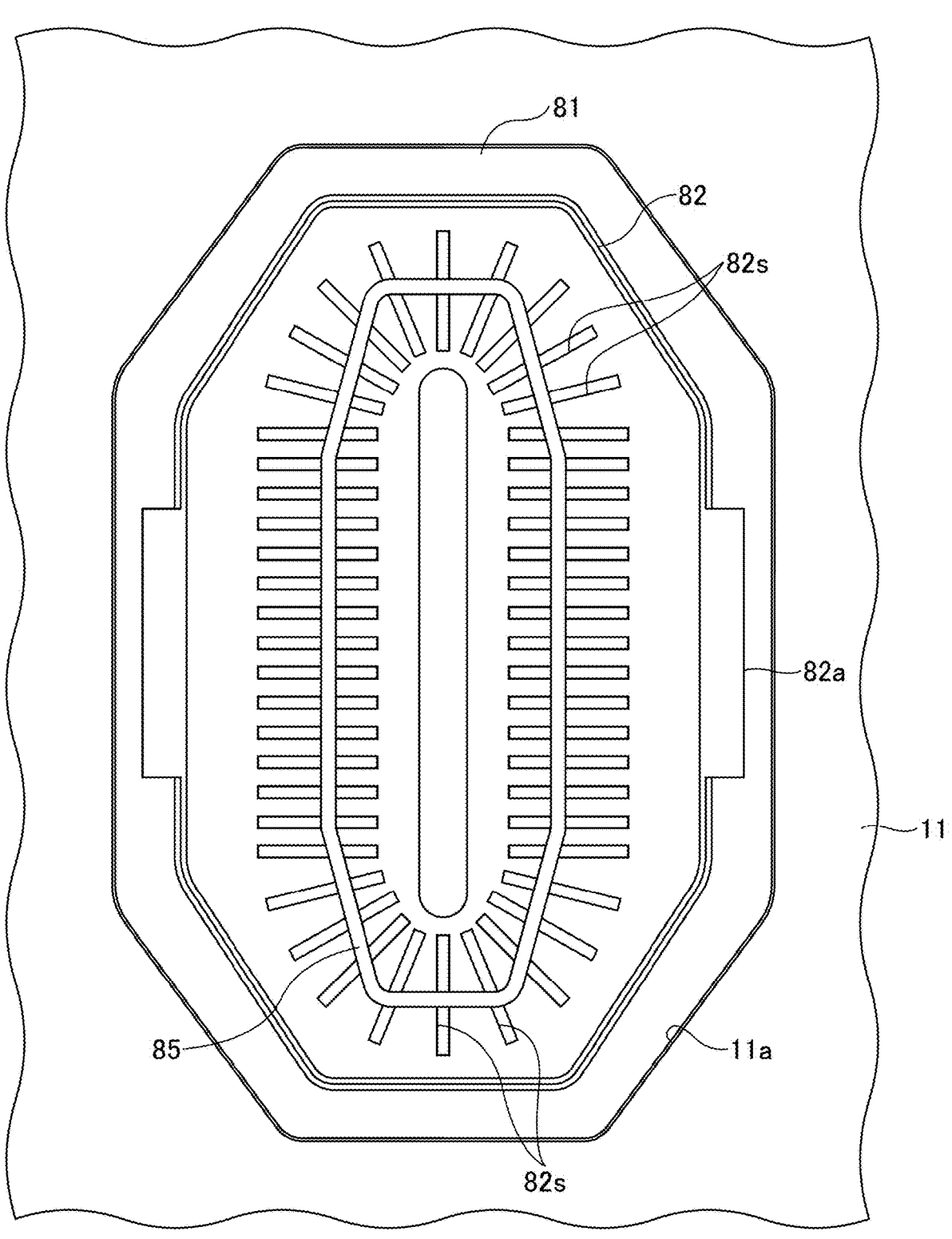
FIG. 8 is a schematic top view illustrating the plasma generator provided in the film-forming apparatus of FIG. 1.
Figure 9:
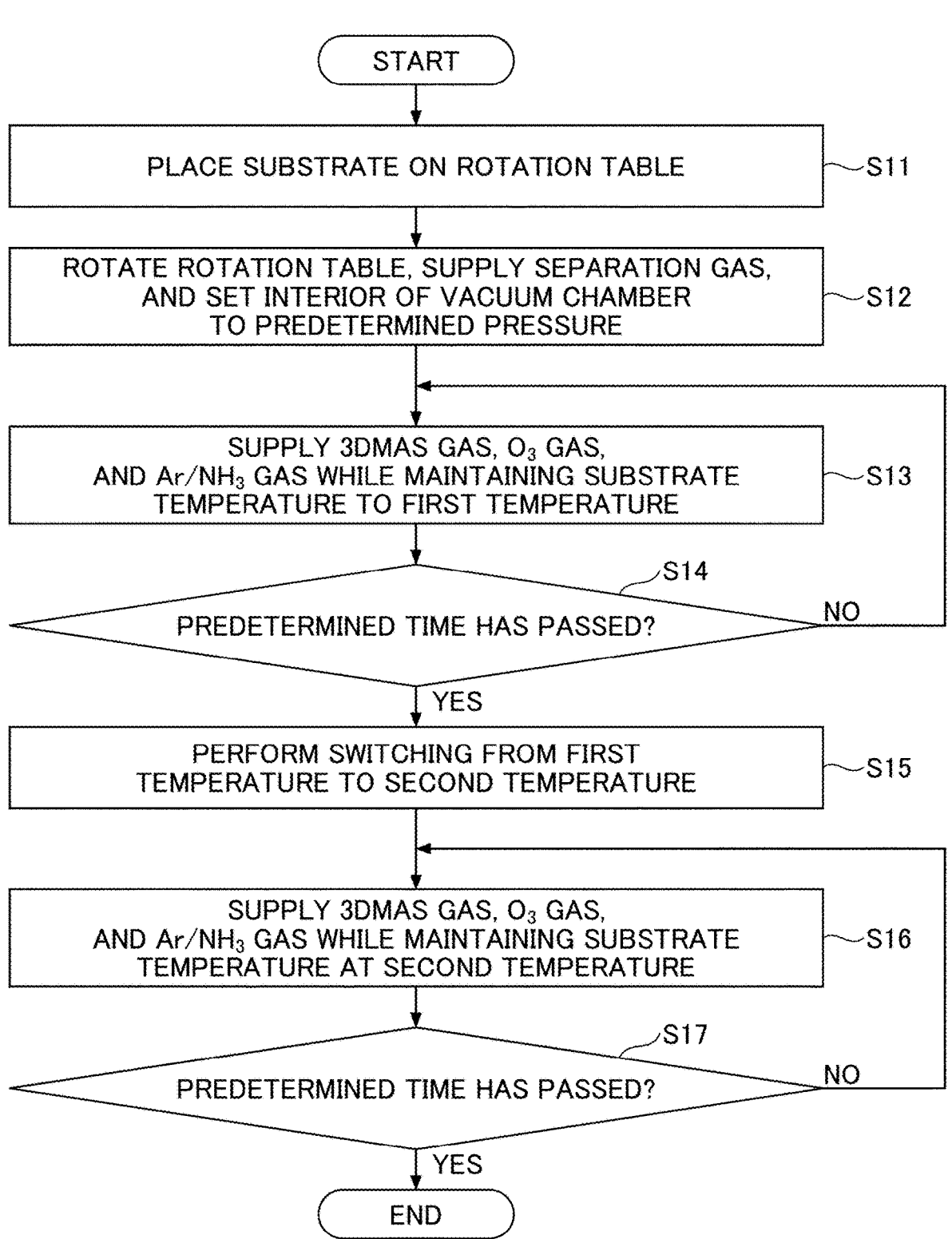
FIG. 9 is a flowchart illustrating a film-forming method according to an embodiment.

The plasma generator 80 will be described with reference to FIGS. 6 to 8. FIG. 6 is a schematic cross-sectional view of the plasma generator 80 taken along a radial direction of the rotation table 2. FIG. 7 is a schematic cross-sectional view of the plasma generator 80 taken along a direction orthogonal to the radial direction of the rotation table 2. FIG. 8 is a top view schematically illustrating the plasma generator 80. For the sake of convenience, some of the members are illustrated in a simplified manner in these drawings.

As illustrated in FIG. 6, the plasma generator 80 includes a frame member 81, a Faraday shielding plate 82, an insulating plate 83, and an antenna 85. The frame member 81 is formed of a material through which high frequencies can permeate. The frame member 81 has a recess formed from the upper surface thereof, and is fitted into an opening 11a formed in the top plate 11. The Faraday shielding plate 82 is housed in the recess of the frame member 81, and has an approximately box-like shape having an opened upper surface. The insulating plate 83 is disposed on the bottom surface of the Faraday shielding plate 82. The antenna 85 is supported above the insulating plate 83. The antenna 85 has a coil shape having an upper surface of an approximately octagonal shape.

The opening 11a in the top plate 11 includes a plurality of steps. One of the steps is provided with a groove that is formed over the entire circumference thereof. A seal member 81a, such as an O-ring or the like, is fitted into the groove. The frame member 81 includes a plurality of steps corresponding to the steps of the opening 11a. When the frame member 81 is fitted into the opening 11a, the rear surface of one of the steps contacts the seal member 81a that is fitted into the groove in the opening 11a. Thereby, airtightness between the top plate 11 and the frame member 81 is maintained. As illustrated in FIG. 6, a press member 81c is provided along the outer circumference of the frame member 81 that is fitted into the opening 11a of the top plate 11. Thereby, the frame member 81 is pressed downward against the top plate 11. This more reliably maintains airtightness between the top plate 11 and the frame member 81.

The lower surface of the frame member 81 faces the rotation table 2 in the vacuum chamber 1. The entire outer circumference of the lower surface thereof is provided with a projection 81b that projects downward (toward the rotation table 2). The lower surface of the projection 81b is close to the surface of the rotation table 2. A space is defined above the rotation table 2 by the projection 81b, the surface of the rotation table 2, and the lower surface of the frame member 81 (hereinafter this space is referred to as an internal space S). The distance between the lower surface of the projection 81b and the surface of the rotation table 2 may be approximately the same as the height h1 of the top plate 11 from the upper surface of the rotation table 2 in the separation space H (FIG. 4).

The processing gas nozzle 92 penetrating the projection 81b extends in the internal space S. As described above, the processing gas nozzle 92 supplies the modification gas from the supply source GS4 and the dilution gas from the supply source GS5, into the vacuum chamber 1 (internal space S).

A plurality of discharge holes 92h are formed in the processing gas nozzle 92 at predetermined intervals (e.g., 10 mm) along the longitudinal direction thereof. The processing gas nozzle 92 is configured to discharge the modification gas and the dilution gas from the discharge holes 92h. As illustrated in FIG. 7, the discharge holes 92h are tilted from a direction perpendicular to the rotation table 2 toward an upstream side in the rotating direction of the rotation table 2. Therefore, the modification gas and the dilution gas supplied from the processing gas nozzle 92 are discharged in a direction opposite to the rotating direction of the rotation table 2, specifically toward the gap between the lower surface of the projection 81b and the surface of the rotation table 2. This prevents flow of the oxidizing gas and the separation gas into the internal space S from the space below the ceiling surface 45 that is located upstream of the plasma generator 80 along the rotating direction of the rotation table 2. As described above, the projection 81*b* formed along the outer circumference of the lower surface of the frame member 81 is close to the surface of the rotation table 2. Therefore, by the presence of the modification gas and the dilution gas from the processing gas nozzle 92, the pressure of the internal space S can be readily maintained to be high. This prevents flow of the oxidizing gas and the separation gas into the internal space S.

The Faraday shielding plate 82 is formed of a conductive material, such as a metal or the like. Although not illustrated, the Faraday shielding plate 82 is grounded. As illustrated in FIG. 8, a plurality of slits 82*s* are formed at the bottom of the Faraday shielding plate 82. Each of the slits 82*s* extends so as to be approximately orthogonal to a corresponding side of the antenna 85 having an approximately octagonal planar shape.

As illustrated in FIGS. 7 and 8, the Faraday shielding plate 82 includes supports 82*a* at two positions on the upper end thereof. The supports 82*a* are bendable outward. By the supports 82*a* being supported by the upper surface of the frame member 81, the Faraday shielding plate 82 is supported at a predetermined position in the frame member 81.

The insulating plate 83 is formed of quartz glass or the like. The insulating plate 83 has a size that is slightly smaller than the bottom surface of the Faraday shielding plate 82. The insulating plate 83 is placed on the bottom surface of the Faraday shielding plate 82. The insulating plate 83 insulates the Faraday shielding plate 82 from the antenna 85. High frequencies irradiated from the antenna 85 pass through the insulating plate 83 downward.

The antenna 85 is formed by winding, for example, a copper hollow tube (pipe) three times so as to have an approximately octagonal planar shape. Cooling water can be circulated in the pipe, thereby preventing the antenna 85 from being heated to a high temperature due to high frequencies applied to the antenna 85. The antenna 85 is provided with an upright portion 85*a*, and a support 85*b* is attached to the upright portion 85*a*. The support 85*b* maintains the antenna 85 at a predetermined position in the Faraday shielding plate 82. A high-frequency power supply 87 is connected to the support 85*b* via a matching box 86. The high-frequency power supply 87 is configured to generate a high frequency having a frequency, for example, of 13.56 MHz.

According to the plasma generator 80 having this configuration, when high-frequency power is supplied to the antenna 85 from the high-frequency power supply 87 via the matching box 86, an electromagnetic field is generated by the antenna 85. Electric-field components of the electromagnetic field are shielded by the Faraday shielding plate 82, and thus cannot propagate downward. Meanwhile, magnetic-field components propagate to the internal space S through the slits 82*s* in the Faraday shielding plate 82. The magnetic-field components generate a plasma from the modification gas and the dilution gas that are supplied to the internal space S from the processing gas nozzle 92.

The film-forming apparatus includes a controller 100. The controller 100 is configured to control the components of the film-forming apparatus. The controller 100 is formed, for example, of a computer. A memory of the controller 100 stores one or more programs causing the film-forming apparatus to perform the below-described film-forming method under control of the controller 100. The program includes a group of steps so as to perform the below-described film-forming method. The program is stored in a medium 102, such as a hard disk, a compact disk, a magneto-optical disk, a memory card, a flexible disk, or the like. The program is read into a storage 101 by a predetermined reader, and installed in the controller 100.

[Film-Forming Method]

A film-forming method according to the embodiment will be described with reference to a case in which the film-forming method is performed by the film-forming apparatus as described above. The film-forming method according to the embodiment is performed by the controller 100 controlling the components of the film-forming apparatus.

Figure 10C:
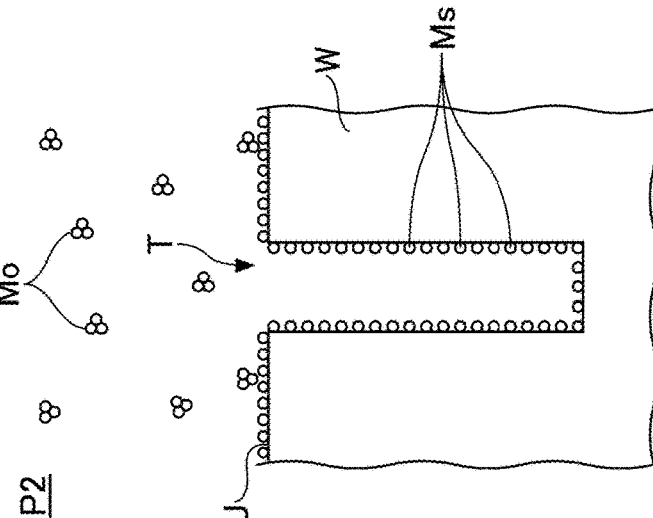
FIGS. 10A to 10C are schematic diagrams (1) describing the film-forming method according to the embodiment.
Figure 10B:
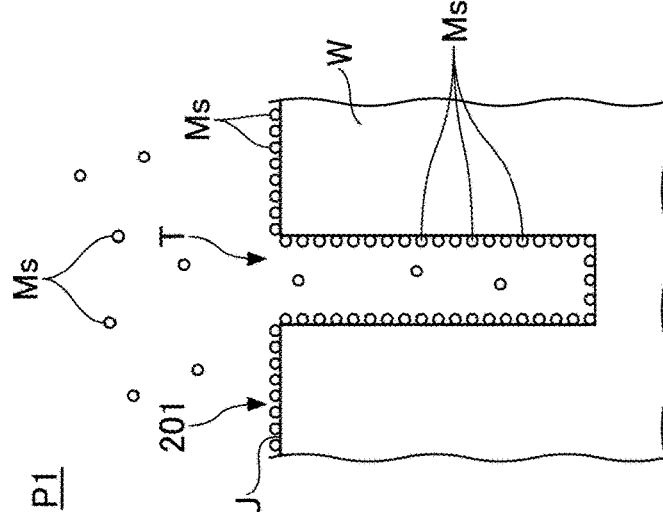
Figure 10A:
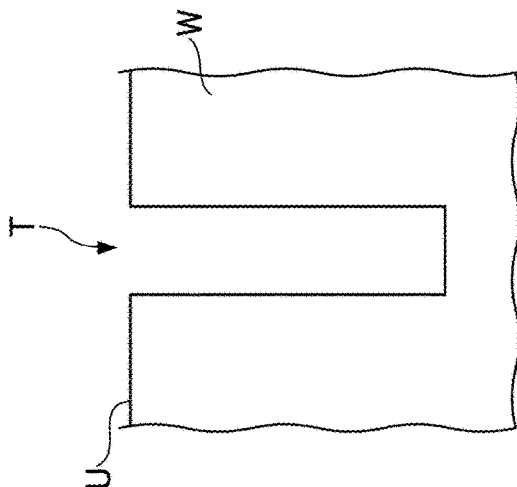

In the embodiment, as illustrated in FIG. 10A, a trench T is formed at a surface U of the substrate W. In the embodiment, the aminosilane-based gas is a 3DMAS gas, the oxidizing gas is an O₃ gas), the modification gas is an NH₃ gas, and the dilution gas is an Ar gas.

First, in step S11, the unillustrated gate valve is opened, and the substrate W is transferred from the exterior into the stage 24 of the rotation table 2 through the transfer port 15 (FIGS. 2 and 3) by means of the transfer arm 10 (FIG. 3). The transfer of the substrate W is performed when the stage 24 stops at the position facing the transfer port 15. Specifically, at this time, the unillustrated raising and lowering pins are raised and lowered from the bottom of the vacuum chamber 1 through the through-holes in the bottom surface of the stage 24. The transfer of the substrate W is performed by intermittently rotating the rotation table 2, thereby placing the substrate W on each of the five stages 24 of the rotation table 2.

Next, in step S12, the gate valve is closed, and the interior of the vacuum chamber 1 is exhausted by the vacuum pump 64 until the maximum possible vacuum degree. Subsequently, the Ar gas is discharged at a predetermined flow rate from the separation gas nozzles 41 and 42, and also the Ar gas is discharged at a predetermined flow rate from the separation gas supply tube 51 and the purge gas supply tubes 72 and 73. In accordance with this, the interior of the vacuum chamber 1 is controlled to a predetermined process pressure by the pressure controller 65 (FIG. 1). Then, the substrate W is heated to a first temperature by the heater 7 while rotating the rotation table 2 clockwise at a predetermined rotation speed. The first temperature is, for example, 620° C. (degrees Celsius).

Next, in step S13, while maintaining the temperature of the substrate W at the first temperature, the 3DMAS gas is supplied from the reactive gas nozzle 31 (FIGS. 2 and 3) and the O₃ gas) is supplied from the reactive gas nozzle 32. Also, a gas mixture of the Ar gas and the NH₃ gas (hereinafter referred to as an "Ar/NH₃ gas") is supplied from the processing gas nozzle 92, and high-frequency power is supplied to the antenna 85 of the plasma generator 80. Thereby, a plasma derived from the Ar/NH₃ gas (hereinafter referred to as an "Ar/NH₃ plasma") is generated in the internal space S between the plasma generator 80 (FIG. 6) and the rotation table 2.

Figure 11C:
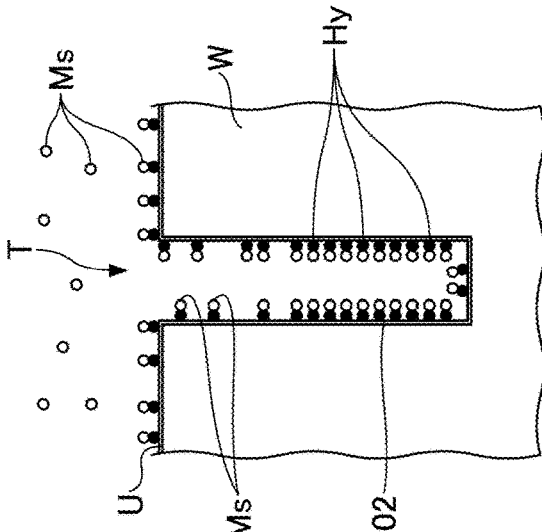
FIGS. 11A to 11C are schematic diagrams (2) describing the film-forming method according to the embodiment.

In accordance with rotation of the rotation table 2, the substrate W repeatedly passes through the first processing region P1, the separation region D, the second processing region P2, the internal space S (the lower region thereof), and the separation region D in this order (see FIG. 3). In the first processing region P1, as illustrated in FIG. 10B, molecules Ms of the 3DMAS gas are adsorbed on the surface U of the substrate W and on the inner surface of the trench T, and a molecular layer 201 of the 3DMAS is formed. After passage through the separation region D, in the second processing region P2, as illustrated in FIG. 10C, the 3DMAS gas adsorbed on the surface U of the substrate W and on the inner surface of the trench T is oxidized by O₃ gas) molecules Mo. As a result, as illustrated in FIG. 11A, a silicon-containing film 202 containing an oxygen atom is formed along the inner surface of the trench T. When the 3DMAS gas is oxidized, OH groups Hy are formed as a by-product. The formed OH groups Hy are adsorbed on the surface of the silicon-containing film 202.

Figure 11B:
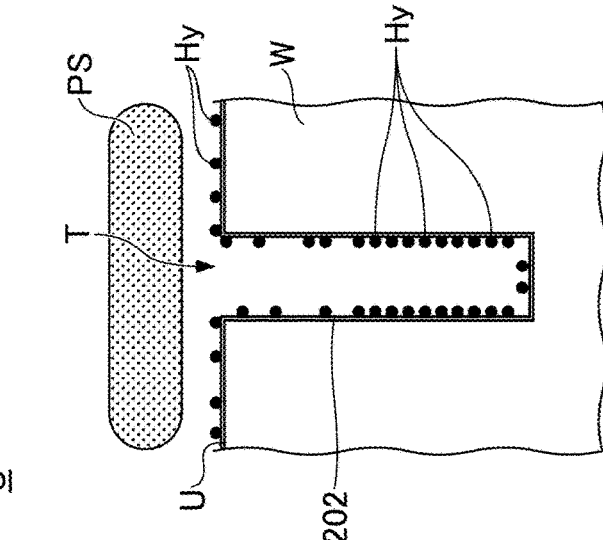
Figure 11A:
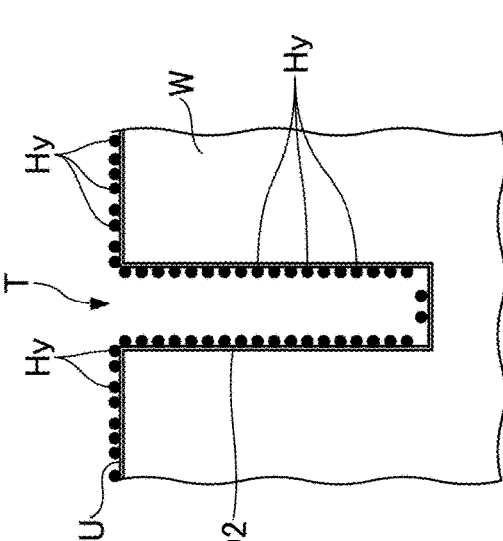

Subsequently, when the substrate W reaches the internal space S of the plasma generator 80, the substrate W is exposed to an Ar/NH$_3$ plasma PS as illustrated in FIG. 11B. At this time, some of the OH groups Hy adsorbed on the silicon-containing film 202 are desorbed from the silicon-containing film 202, for example, through collision of high-energy particles in the Ar/NH$_3$ plasma PS. The Ar/NH$_3$ plasma PS reaches the surface U of the substrate W and the vicinity of the opening of the trench T. However, the Ar/NH$_3$ plasma PS is unlikely to reach the vicinity of the bottom of the trench T. Therefore, a relatively large amount of the OH groups Hy are desorbed from the surface U of the substrate W and from the side surface in the vicinity of the opening of the trench T. As a result, as illustrated in FIG. 11B, the OH groups Hy are distributed such that the density of the OH groups Hy becomes higher at the bottom of the trench T and on the side surface in the vicinity of the bottom of the trench T, and the density of the OH groups Hy becomes lower toward the opening of the trench T and toward the surface U of the substrate W. The silicon-containing film 202 is exposed to the Ar/NH$_3$ plasma, thereby becoming a silicon oxynitride (SiON) film containing an oxygen atom and a nitrogen atom.

Next, when the substrate W reaches the first processing region P1 again by rotation of the rotation table 2, the molecules Ms of the 3DMAS gas supplied from the reactive gas nozzle 31 are adsorbed on the surface U of the substrate W and on the inner surface of the trench T. The molecules Ms of the 3DMAS gas are likely to be adsorbed to the OH groups Hy. Thus, as illustrated in FIG. 11C, the molecules Ms of the 3DMAS gas are adsorbed on the surface U of the substrate W and on the inner surface of the trench T in a distribution in accordance with the distribution of the OH groups Hy. That is, the molecules Ms of the 3DMAS gas are adsorbed on the inner surface of the trench T such that the density of the molecules Ms of the 3DMAS gas becomes higher at the bottom of the trench T and on the side surface in the vicinity of the bottom of the trench T, and the density of the molecules Ms of the 3DMAS gas becomes lower toward the opening of the trench T.

Figure 12A:
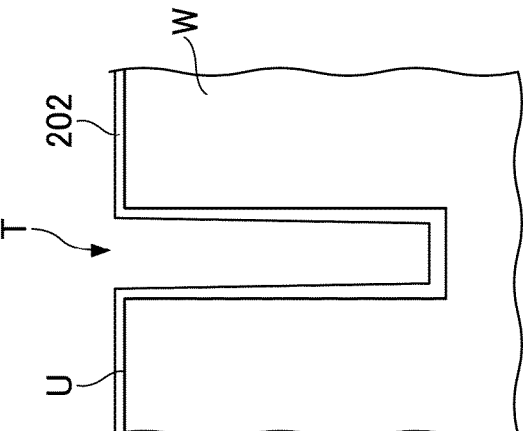
FIGS. 12A to 12C are schematic diagrams (3) describing the film-forming method according to the embodiment.

Subsequently, when the substrate W passes through the second processing region P2, the 3DMAS gas adsorbed on the surface U of the substrate W and on the inner surface of the trench T is oxidized by the O$_3$ gas), thereby further forming the silicon-containing film 202 as illustrated in FIG. 12A. At this time, a thickness distribution of the silicon-containing film 202 reflects the density of the 3DMAS gas adsorbed on the inner surface of the trench T. That is, the silicon-containing film 202 becomes thicker at the bottom of the trench T and on the side surface in the vicinity of the bottom of the trench T, and becomes thinner toward the opening of the trench T. Then, the OH groups formed by the oxidation of the 3DMAS gas are adsorbed on the surface of the silicon-containing film 202.

Next, when the substrate W reaches the internal space S of the plasma generator 80 again, as described above, the OH groups are distributed such that the density of the OH groups becomes higher at the bottom of the trench T and on the side surface in the vicinity of the bottom of the trench T, and the density of the OH groups becomes lower toward the opening of the trench T.

Figure 12B:
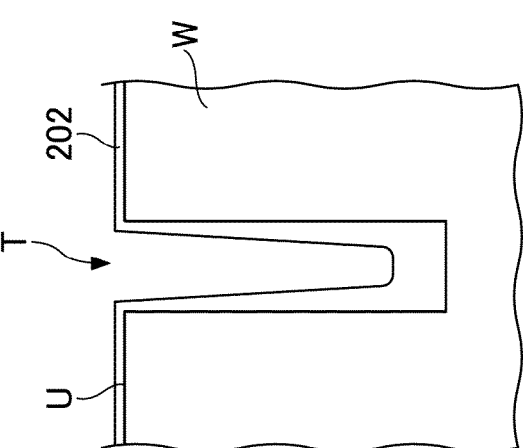

Subsequently, when the above-described process (hereinafter referred to as a "first process") is repeated, the silicon-containing film 202 becomes thicker from the bottom of the trench T as illustrated in FIG. 12B.

While the first process is repeated, the controller 100 determines whether or not the supply of the 3DMAS gas from the reactive gas nozzle 31 has been performed for a corresponding predetermined time, the supply of the O$_3$ gas from the reactive gas nozzle 32 has been performed for a corresponding predetermined time, and the supply of the Ar/NH$_3$ gas from the processing gas nozzle 92 has been performed for a corresponding predetermined time (step S14). In the determination in step S14, instead of the time of the gas supply, the controller 100 may determine whether or not the rotation table 2 has been rotated a predetermined number of times. The predetermined time and the predetermined number of times can be determined in accordance with the depth of the trench T, the opening width of the trench T, and the like.

If the predetermined time has not passed (NO in step S14), the first process is repeated. If the predetermined time has passed (YES in step S14), the controller 100 stops the supply of the 3DMAS gas from the reactive gas nozzle 31, the supply of the O$_3$ gas) from the reactive gas nozzle 32, and the supply of the Ar/NH$_3$ gas from the processing gas nozzle 92. Also, the controller 100 stops the supply of the high-frequency power to the antenna 85 of the plasma generator 80. Subsequently, the controller 100 changes the temperature of the substrate W from the first temperature to a second temperature by means of the heater 7 while rotating the rotation table 2 (step S15). The second temperature is, for example, 400° C.

Next, in step S16, while maintaining the temperature of the substrate W at the second temperature, the 3DMAS gas is supplied from the reactive gas nozzle 31 (FIGS. 2 and 3) and the O$_3$ gas) is supplied from the reactive gas nozzle 32. Also, the Ar/NH$_3$ gas is supplied from the processing gas nozzle 92 and high-frequency power is supplied to the antenna 85 of the plasma generator 80. This generates the Ar/NH$_3$ plasma in the internal space S between the plasma generator 80 (FIG. 6) and the rotation table 2.

Figure 12C:
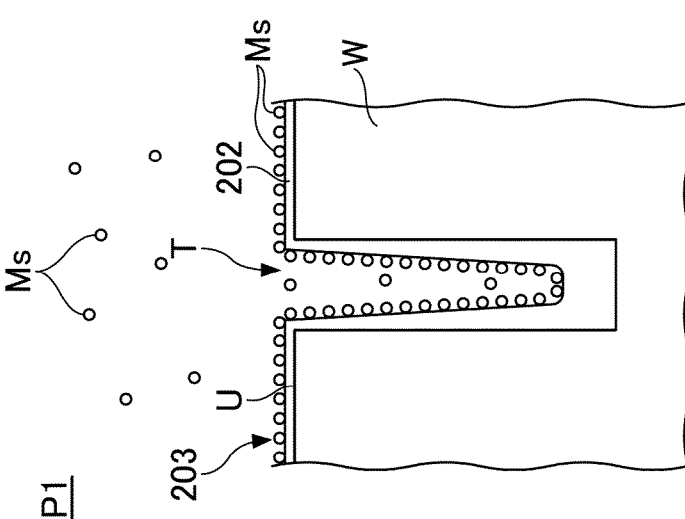

In accordance with rotation of the rotation table 2, the substrate W repeatedly passes through the first processing region P1, the separation region D, the second processing region P2, the internal space S (the lower region thereof), and the separation region D in this order (see FIG. 3). In the first processing region P1, as illustrated in FIG. 12C, molecules Ms of the 3DMAS gas are adsorbed on the surface U of the substrate W and on the inner surface of the trench T, and a molecular layer 203 of the 3DMAS is formed. After passage through the separation region D, in the second processing region P2, as illustrated in FIG. 13A, the 3DMAS gas adsorbed on the surface U of the substrate W and on the inner surface of the trench T is oxidized by O$_3$ gas) molecules Mo. As a result, as illustrated in FIG. 13B, a silicon-containing film 204 containing oxygen atoms is formed along the inner surface of the trench T. When the 3DMAS gas is oxidized, OH groups Hy are formed as a by-product. The formed OH groups Hy are adsorbed on the surface of the silicon-containing film 204.

Figure 13C:
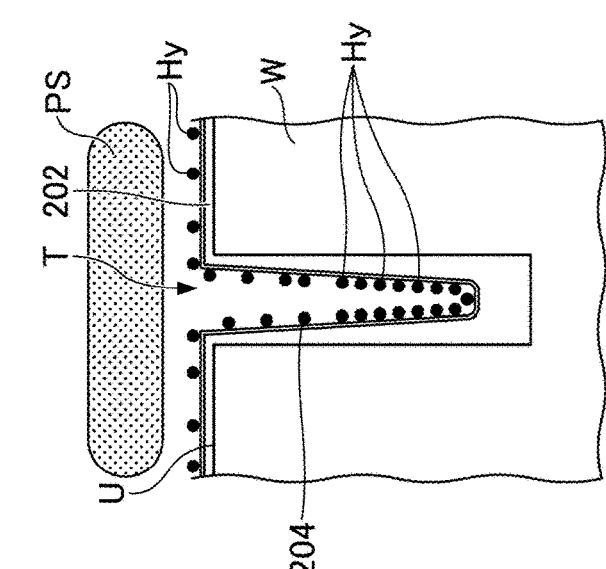
FIGS. 13A to 13C are schematic diagrams (4) describing the film-forming method according to the embodiment.
Figure 13B:
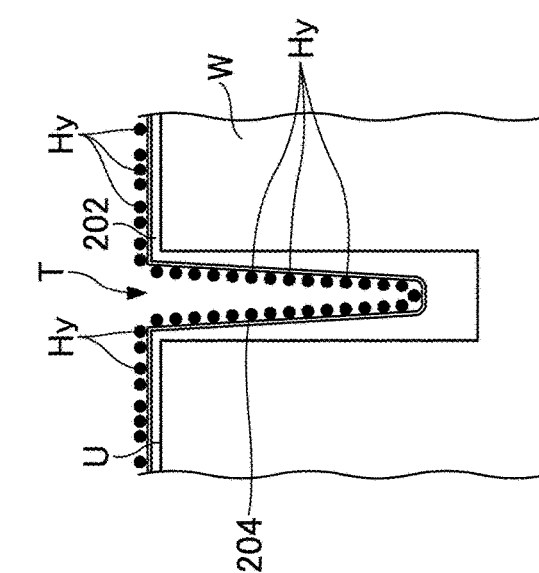
Figure 13A:
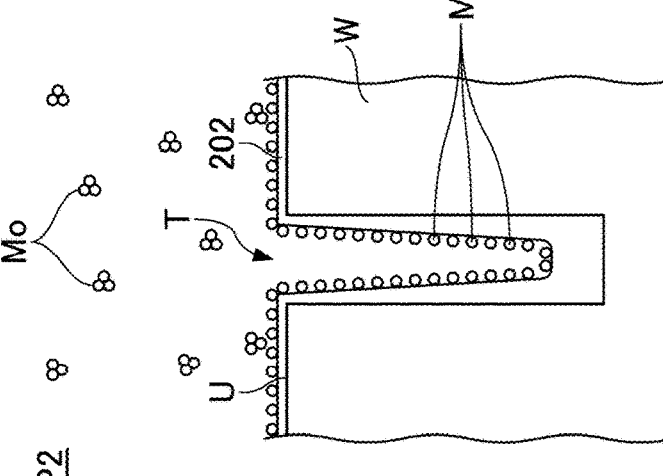

Subsequently, when the substrate W reaches the internal space S of the plasma generator 80, the substrate W is exposed to an Ar/NH$_3$ plasma PS as illustrated in FIG. 13C. At this time, some of the OH groups Hy adsorbed on the silicon-containing film 204 are desorbed from the silicon-containing film 204, for example, through collision of high-energy particles in the Ar/NH$_3$ plasma PS. The Ar/NH$_3$ plasma PS reaches the surface U of the substrate W and the vicinity of the opening of the trench T. However, the $Ar/NH_3$ plasma PS is unlikely to reach the vicinity of the bottom of the trench T. Therefore, a relatively large amount of the OH groups Hy are desorbed from the surface U of the substrate W and from the side surface in the vicinity of the opening of the trench T. As a result, as illustrated in FIG. 13C, the OH groups Hy are distributed such that the density of the OH groups Hy becomes higher at the bottom of the trench T and on the side surface in the vicinity of the bottom of the trench T, and the density of the OH groups Hy becomes lower toward the opening of the trench T and toward the surface U of the substrate W. The silicon-containing film 204 is exposed to the $Ar/NH_3$ plasma, thereby becoming a SiON film containing an oxygen atom and a nitrogen atom.

Figure 14C:
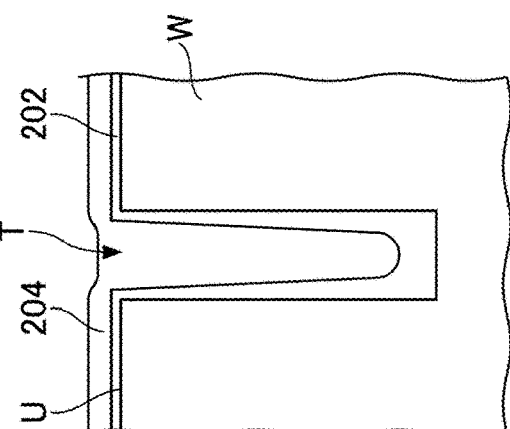
FIGS. 14A to 14C are schematic diagrams (5) describing the film-forming method according to the embodiment.

Next, when the substrate W reaches the first processing region P1 again by rotation of the rotation table 2, the molecules Ms of the 3DMAS gas supplied from the reactive gas nozzle 31 are adsorbed on the surface U of the substrate W and on the inner surface of the trench T. The molecules Ms of the 3DMAS gas are likely to be adsorbed to the OH groups Hy. Thus, as illustrated in FIG. 14A, the molecules Ms of the 3DMAS gas are adsorbed on the surface U of the substrate W and on the inner surface of the trench T in a distribution in accordance with the distribution of the OH groups Hy. That is, the molecules Ms of the 3DMAS gas are adsorbed on the inner surface of the trench T such that the density of the molecules Ms of the 3DMAS gas becomes higher at the bottom of the trench T and on the side surface in the vicinity of the bottom of the trench T, and the density of the molecules Ms of the 3DMAS gas becomes lower toward the opening of the trench T.

Figure 14B:
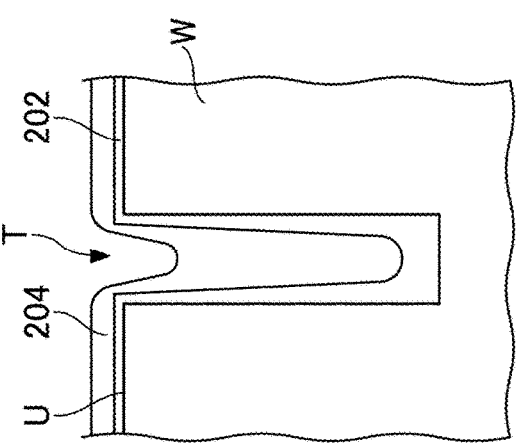
Figure 14A:
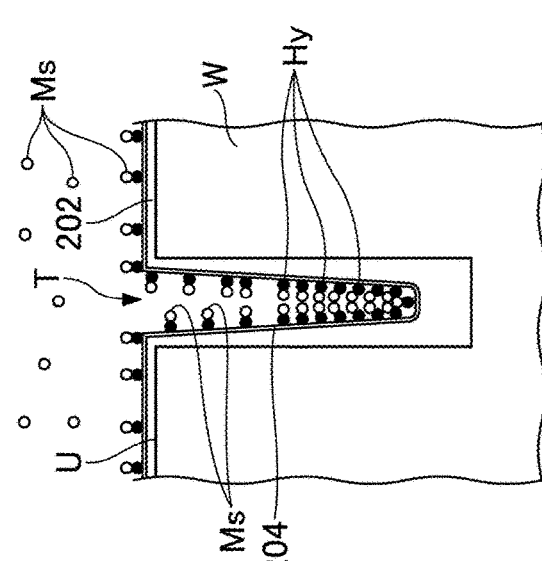

Subsequently, when the substrate W passes through the second processing region P2, the 3DMAS gas adsorbed on the surface U of the substrate W and on the inner surface of the trench T is oxidized by the $O_3$ gas), thereby further forming the silicon-containing film 204 as illustrated in FIG. 14B. At this time, a thickness distribution of the silicon-containing film 204 reflects the density of the 3DMAS gas adsorbed on the inner surface of the trench T. That is, the silicon-containing film 204 becomes thicker at the bottom of the trench T and on the side surface in the vicinity of the bottom of the trench T, and becomes thinner toward the opening of the trench T. Then, the OH groups formed by the oxidation of the 3DMAS gas are adsorbed on the surface of the silicon-containing film 204.

Next, when the substrate W reaches the internal space S of the plasma generator 80 again, as described above, the OH groups are distributed such that the density of the OH groups becomes higher at the bottom of the trench T and on the side surface in the vicinity of the bottom of the trench T, and the density of the OH groups becomes lower toward the opening of the trench T.

Subsequently, when the above-described process (hereinafter referred to as a "second process") is repeated, the silicon-containing film 204 becomes thicker from the bottom of the trench T as illustrated in FIG. 14C. As a result, the trench T is embedded with silicon oxide without voids, and embedment of the trench T is completed.

While the second process is repeated, the controller 100 determines whether or not the supply of the 3DMAS gas from the reactive gas nozzle 31 has been performed for a corresponding predetermined time, the supply of the $O_3$ gas) from the reactive gas nozzle 32 has been performed for a corresponding predetermined time, and the supply of the $Ar/NH_3$ gas from the processing gas nozzle 92 has been performed for a corresponding predetermined time (step S17). In the determination in step S17, instead of the time of the gas supply, the controller 100 may determine whether or not the rotation table 2 has been rotated a predetermined number of times. The predetermined time and the predetermined number of times can be determined in accordance with the depth of the trench T, the opening width of the trench T, and the like.

If the predetermined time has not passed (NO in step S17), the second process is repeated. If the predetermined time has passed (YES in step S17), the controller 100 ends the process. As a result, as illustrated in 14C, the trench T is embedded with the silicon-containing films 202 and 204 without voids.

According to the embodiment, the OH groups, formed by oxidation of the aminosilane-based gas and adsorbed on the silicon-containing films 202 and 204, are distributed by the action of the $Ar/NH_3$ plasma such that the density of the OH groups becomes higher at the bottom of the trench T and on the side surface in the vicinity of the bottom of the trench T, and the density of the OH groups becomes lower toward the opening of the trench T. The OH groups serve as adsorption sites for the aminosilane-based gas, and the aminosilane-based gas is adsorbed in accordance with the distribution of the OH groups. Therefore, the aminosilane-based gas is also distributed such that the density of the aminosilane-based gas becomes higher at the bottom of the trench T and on the side surface in the vicinity of the bottom of the trench T, and the density of the aminosilane-based gas becomes lower toward the opening of the trench T. As a result, the silicon-containing films 202 and 204 are formed so as to be thick at the bottom of the trench T and on the side surface in the vicinity of the bottom of the trench T, and so as to be thin toward the opening of the trench T.

According to the embodiment, the temperature of the substrate W is changed from the first temperature to the second temperature during film formation of the silicon-containing films 202 and 204. In this case, it is possible to control the shape of the silicon-containing films 202 and 204 embedded in the trench T. The following is a conceivable reason why it is possible to control the shape of the silicon-containing films 202 and 204 embedded in the trench T.

Figure 15:
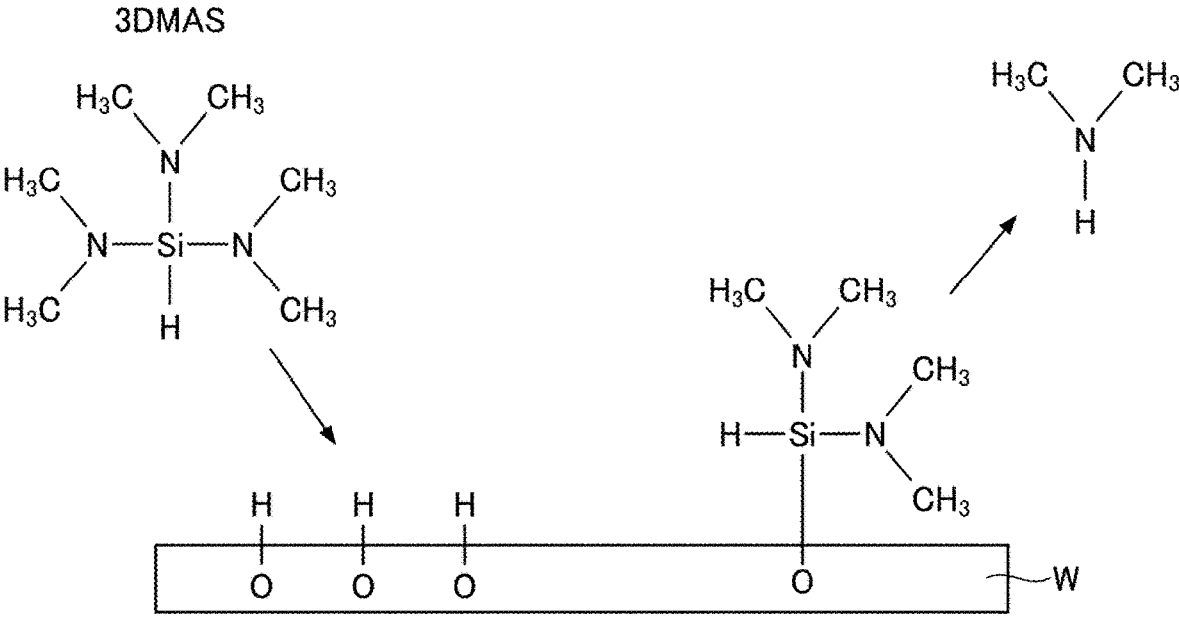
FIG. 15 is a schematic diagram describing reaction of a 3DMAS gas on a surface of a substrate.

FIG. 15 is a schematic diagram describing reaction of the 3DMAS gas on the surface of the substrate W. As illustrated in FIG. 15, when the 3DMAS gas is supplied to the surface of the substrate W, the 3DMAS gas is adsorbed to the OH groups on the surface of the substrate W. As a result, hydrogen atoms (H) bonded to a silicon atom (Si) (hereinafter these hydrogen atoms are referred to as a "silicon-bonded hydrogen atom") are formed on the surface of the substrate W.

The silicon-bonded hydrogen atoms present on the surface of the substrate W can be desorbed during film formation of the silicon-containing films 202 and 204. The number of the silicon-bonded hydrogen atoms desorbed increases as the temperature of the substrate W decreases. When the silicon-bonded hydrogen atoms are desorbed as the aminosilane-based gas is supplied, adsorption of the aminosilane-based gas onto the surface of the substrate W is promoted, and the film formation rates of the silicon-containing films 202 and 204 are increased. Therefore, as the temperature of the substrate W decreases, the number of the silicon-bonded hydrogen atoms desorbed increases. As a result, the film formation rates of the silicon-containing films 202 and 204 become higher.

Change in the film formation rates of the silicon-containing films 202 and 204 becomes greater at the bottom of the trench T and on the side surface in the vicinity of the bottom of the trench T, where the amount of the aminosilane-based gas adsorbed is larger, than in the vicinity of the opening of the trench T, where the amount of the aminosilane-based gas adsorbed is smaller. Therefore, when the temperature of the substrate W is changed, the film thicknesses of the silicon-containing films 202 and 204 formed at the bottom of the trench T and on the side surface in the vicinity of the bottom of the trench T are changed to a greater extent than the film thicknesses of the silicon-containing films 202 and 204 formed in the vicinity of the opening of the trench T. As a result, the shape of the silicon-containing films 202 and 204 embedded in the trench T is controlled.

In the embodiment as described above, the first temperature is 620° C., and the second temperature is 400° C. However, there are by no means limitations. The first temperature and the second temperature may be at least different temperatures. The first temperature and the second temperature may be selected in accordance with the shape intended to be formed when the trench T is embedded with the silicon-containing films 202 and 204.

The first temperature and the second temperature are, for example, temperatures at which the aminosilane-based gas is not decomposed. A temperature at which the 3DMAS gas is not decomposed is, for example, 760° C. or lower. A temperature at which the DIPAS gas is not decomposed is, for example, 600° C. or lower.

For example, the first temperature may be a temperature that is higher than the second temperature. In this case, in the former stage of film formation, bottom-up film formation can be maintained, and the film thickness of the silicon-containing film 202, formed at the bottom of the trench T and on the side surface in the vicinity of the bottom of the trench T, can be reduced. Therefore, it is more likely to suppress clogging of the vicinity of the opening of the trench T and the like caused by the silicon-containing film 202 in the former stage of the film formation. In the latter stage of the film formation, the silicon-containing film 204 having a high bottom-up property can be embedded. Therefore, the silicon-containing film 204 is readily embedded in the trench T without voids.

Also, in the embodiment as described above, the temperature of the substrate W is changed once during the film formation of the silicon-containing film. However, this is by no means a limitation. For example, the temperature of the substrate W may be changed twice or more during the film formation of the silicon-containing film. For example, in the film formation of the silicon-containing film, the temperature of the substrate W may be maintained at the first temperature first, then the temperature of the substrate W may be maintained at the second temperature, and finally the temperature of the substrate W may be maintained at the first temperature. For example, in the film formation of the silicon-containing film, the temperature of the substrate W may be maintained at the first temperature first, then the temperature of the substrate W may be maintained at the second temperature, and finally the temperature of the substrate W may be maintained at a third temperature. In this case, the first temperature may be higher than the second temperature, and the second temperature may be higher than the third temperature. Thereby, it is more likely to improve characteristics of embedment of the silicon-containing film in a deep trench.

In the embodiment as described above, the oxidizing gas is the $O_3$ gas). However, this is by no means a limitation. For example, the oxidizing gas may be an O-gas, a $H_2O$ gas, or a $H_2O_2$ gas.

Also, every time the first process to be performed for a predetermined time is repeated, the supply of the 3DMAS gas from the reactive gas nozzle 31 may be stopped while continuing the supply of the $O_3$ gas) from the reactive gas nozzle 32 and the supply of the $Ar/NH_3$ gas from the processing gas nozzle 92. In this case, the substrate W is exposed to the $Ar/NH_3$ gas without supply of the 3DMAS gas to the substrate W. Therefore, it is possible to suppress growth of the silicon-containing film caused by desorption of the silicon-bonded hydrogen atoms present on the surfaces of the silicon-containing films 202 and 204.

Also, every time the second process to be performed for a predetermined time is repeated, the supply of the 3DMAS gas from the reactive gas nozzle 31 may be stopped while continuing the supply of the $O_3$ gas) from the reactive gas nozzle 32 and the supply of the $Ar/NH_3$ gas from the processing gas nozzle 92. In this case, the substrate W is exposed to the $Ar/NH_3$ gas without supply of the 3DMAS gas to the substrate W. Therefore, it is possible to suppress growth of the silicon-containing film caused by desorption of the silicon-bonded hydrogen atoms present on the surfaces of the silicon-containing films 202 and 204.

Also, in the embodiment as described above, in the single vacuum chamber 1, the first process is repeatedly performed, then the temperature of the substrate W is changed from the first temperature to the second temperature, and then the second process is repeatedly performed. However, this is by no means a limitation. For example, first, the first process may be repeatedly performed in a first vacuum chamber that is adjusted such that the temperature of the substrate W becomes the first temperature, and next the second process may be repeatedly performed in a second vacuum chamber that is adjusted such that the temperature of the substrate W becomes the second temperature. In this case, it is possible to reduce the time required for changing the temperature of the substrate W from the first temperature to the second temperature. For example, the first vacuum chamber and the second vacuum chamber may be connected to the same vacuum transfer chamber. In this case, it is possible to transfer the substrate W from the first vacuum chamber to the second vacuum chamber through the same vacuum transfer chamber. Therefore, after performing the first process, the second process can be repeatedly performed successively without exposing the substrate W to the atmosphere. The configurations of the first vacuum chamber and the second vacuum chamber may be the same as the configuration of the vacuum chamber 1 as described above.

EXAMPLES

In examples, a thickness distribution of the silicon-containing film in a depth direction of a trench was measured when the temperature of the substrate upon forming the silicon-containing film was changed.

First, a substrate including a trench at a surface thereof was provided. The depth of the trench was 7.2 μm (micrometers). Next, step S11, step S12, step S13, and step S14 were performed on the provided substrate in this order. In step S12, the substrate was heated to a predetermined temperature by the heater 7 while rotating the rotation table 2 clockwise at a rotational speed of 10 rpm (rotations per minute). In step S13, the 3DMAS gas was supplied from the reactive gas nozzle 31, and the $O_3$ gas) was supplied from the reactive gas nozzle 32. The $Ar/NH_3$ gas was supplied from the processing gas nozzle 92, and a high frequency having a frequency of 13.56 MHz was applied at a power of 2 kW to the antenna 85 of the plasma generator 80.

The examples made a comparison between the film thickness distributions of the silicon-containing film in the depth direction of the trench when the temperature of the substrate upon forming the silicon-containing film was changed. The temperature of the substrate upon forming the silicon-containing film was adjusted to 400° C. or 620° C.

Figure 16:
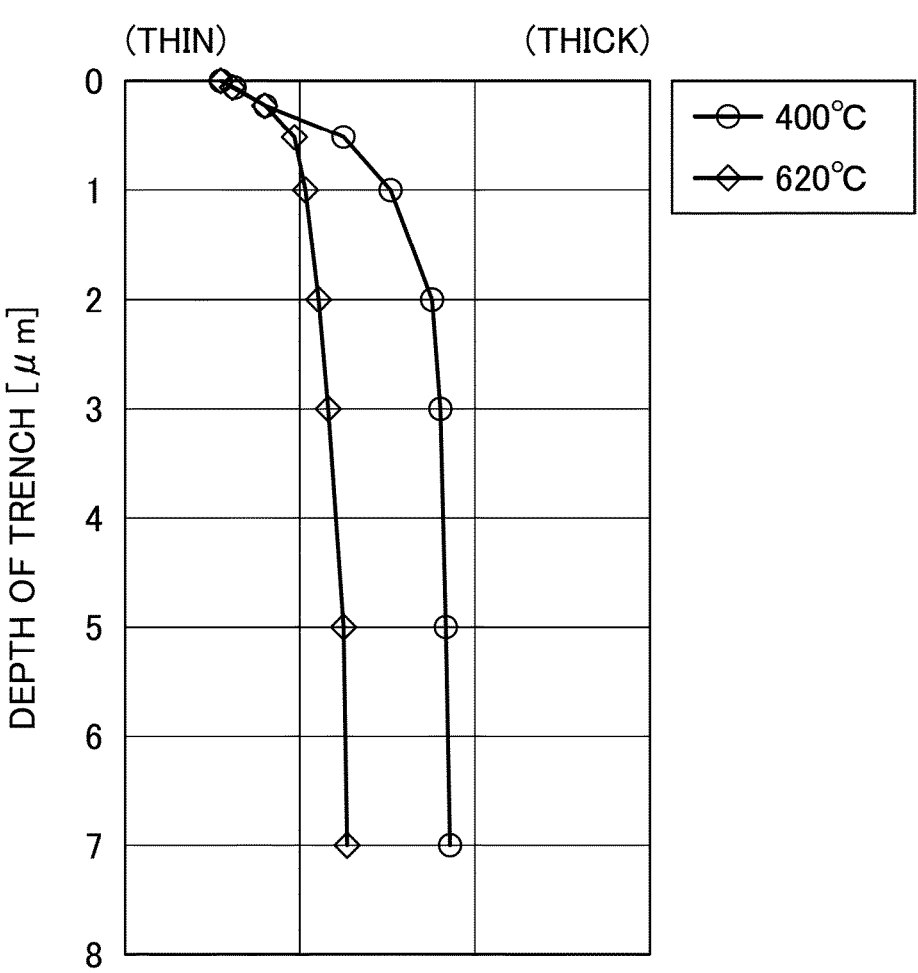
FIG. 16 is a graph illustrating a film thickness distribution of a silicon-containing film in a depth direction of a trench.

FIG. 16 is a graph illustrating the film thickness distribution of the silicon-containing film in the depth direction of the trench. In FIG. 16, the vertical axis indicates the depth [μm] of the trench, and the horizontal axis indicates the film thickness of the silicon-containing film. In FIG. 16, a circle mark indicates the result when the temperature of the substrate was 400° C., and a rhombus mark indicates the result when the temperature of the substrate was 620° C.

FIG. 16 demonstrates that the film thickness distribution of the silicon-containing film in the depth direction of the trench is different between when the temperature of the substrate was 400° C. and when the temperature of the substrate was 620° C. This result suggests that it is possible to control the shape of the silicon-containing film embedded in the trench by changing the temperature of the substrate upon forming the silicon-containing film.

For example, by adjusting the temperature of the substrate to 620° C. instead of adjusting the temperature of the substrate to 400° C., it is possible to maintain a V shape in which the film thickness decreases from the bottom of the trench toward the opening of the trench, and reduce the film thickness at the bottom of the trench.

The embodiments disclosed herein should be construed as being illustrative in all respects and non-limiting. Omissions, substitutions, and changes are possible in the above embodiments in various forms without departing from the scope and intent of the accompanying claims.

In the embodiments as described above, the plasma generator is an inductively coupled plasma (ICP) source including an antenna. However, the present disclosure is not limited thereto. For example, the plasma generator 80 may be a capacitively coupled plasma (CCP) source configured to generate a plasma by applying a high frequency between two rod electrodes that extend parallel to each other.

In the embodiments as described above, the film-forming apparatus is an apparatus configured to process the substrate placed on the rotation table while rotating the substrate. However, the present disclosure is not limited thereto. For example, the film-forming apparatus may be an apparatus including a rotation mechanism configured to rotate the stage of the substrate in the rotation table so as to spin the substrate placed on the rotation table while rotating the substrate, i.e., the film-forming apparatus may be an apparatus configured to process the substrate placed on the rotation table while spinning and rotating the substrate. In this case, uniformity of the process in the plane of the substrate is improved.

In the embodiments as described above, the film-forming apparatus is a semi-batch-type apparatus. However, the present disclosure is not limited thereto. For example, the film-forming apparatus may be a single film-forming apparatus configured to process substrates one by one. For example, the film-forming apparatus may be a batch-type apparatus configured to process a plurality of substrates at once.

According to the present disclosure, it is possible to control the shape of the silicon-containing film embedded in the recess formed at the substrate.

What is claimed is:

1. A film-forming method comprising:
(a) supplying an aminosilane-based gas to a recess formed at a substrate and adsorbing the aminosilane-based gas to an inner surface of the recess;
(b) supplying an oxidizing gas to the recess to which the aminosilane-based gas is adsorbed and reacting the aminosilane-based gas with the oxidizing gas;
(c) exposing the substrate to a plasma generated from a modification gas; and
(d) repeatedly performing a first process including (a), (b), and (c) in an order of (a), (b), and (c), thereby forming a silicon-containing film, wherein
(d) includes changing a temperature of the substrate from a first temperature to a second temperature during repetition of the first process,
the first temperature is a temperature that is higher than the second temperature, and
both of the first temperature and the second temperature are temperatures at which the aminosilane-based gas is not decomposed.

2. The film-forming method according to claim 1, wherein the temperature of the substrate is first maintained at the first temperature in the first process to be repeated.

3. The film-forming method according to claim 1, wherein the aminosilane-based gas is a tris(dimethylamino)silane (3DMAS) gas.

4. The film-forming method according to claim 1, further comprising:
(e) supplying the oxidizing gas to the recess;
(f) exposing the substrate to a plasma generated from a dilution gas; and
(g) repeating a second process including (e) and (f) in an order of (e) and (f), wherein (d) includes performing (g) during the repetition of the first process.

5. The film-forming method according to claim 1, wherein (d) includes using two vacuum chambers that are maintained at different temperatures, and changing the temperature of the substrate by transferring the substrate from one of the two vacuum chambers to another one of the two vacuum chambers.

* * * * *